United States Patent [19]

Rado et al.

[11] 4,236,207
[45] Nov. 25, 1980

[54] MEMORY INITIALIZATION CIRCUIT

[75] Inventors: Peter J. Rado, Acton; Srirama S. Durvasula, Chelmsford; William H. Angell, Concord, all of Mass.

[73] Assignee: Digital Equipment Corporation, Maynard, Mass.

[21] Appl. No.: 954,550

[22] Filed: Oct. 25, 1978

Related U.S. Application Data

[63] Continuation-in-part of Ser. No. 845,417, Oct. 25, 1977, abandoned.

[51] Int. Cl.³ .............................................. G06F 13/00
[52] U.S. Cl. ................................................... 364/200
[58] Field of Search ... 364/200 MS File, 900 MS File; 365/220, 230, 238

[56] References Cited

U.S. PATENT DOCUMENTS

| 3,972,028 | 7/1976 | Weber et al. | 364/200 |
| 4,092,728 | 5/1978 | Baltzer | 364/900 |

*Primary Examiner*—Raulfe B. Zache
*Attorney, Agent, or Firm*—Cesari and McKenna

[57] ABSTRACT

An initialization circuit for a dynamic memory element in a data processing system. The dynamic memory element comprises plural storage modules and a refreshing cycle counter that addresses individual storage locations in said modules in sequence. Address decoding circuitry normally enables a transfer with only one storage module at a time. During initialization, however, the initialization circuit forces the address decoding circuitry to identify all storage modules simultaneously and forces a data circuit to transmit a known value to the dynamic memory. All modules are thereby loaded in parallel with corresponding storage locations in each module being selected by the refreshing cycle counter.

6 Claims, 38 Drawing Figures

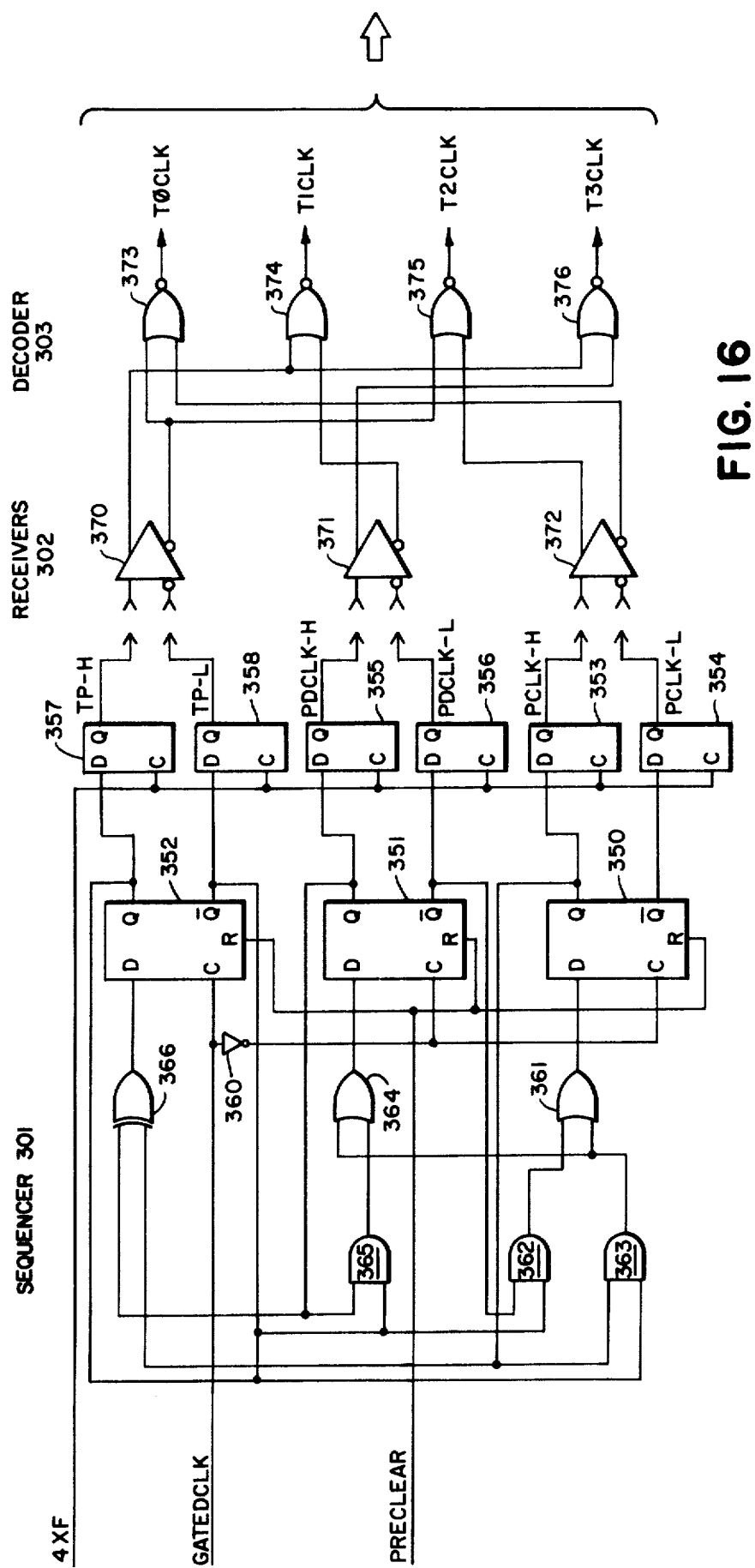

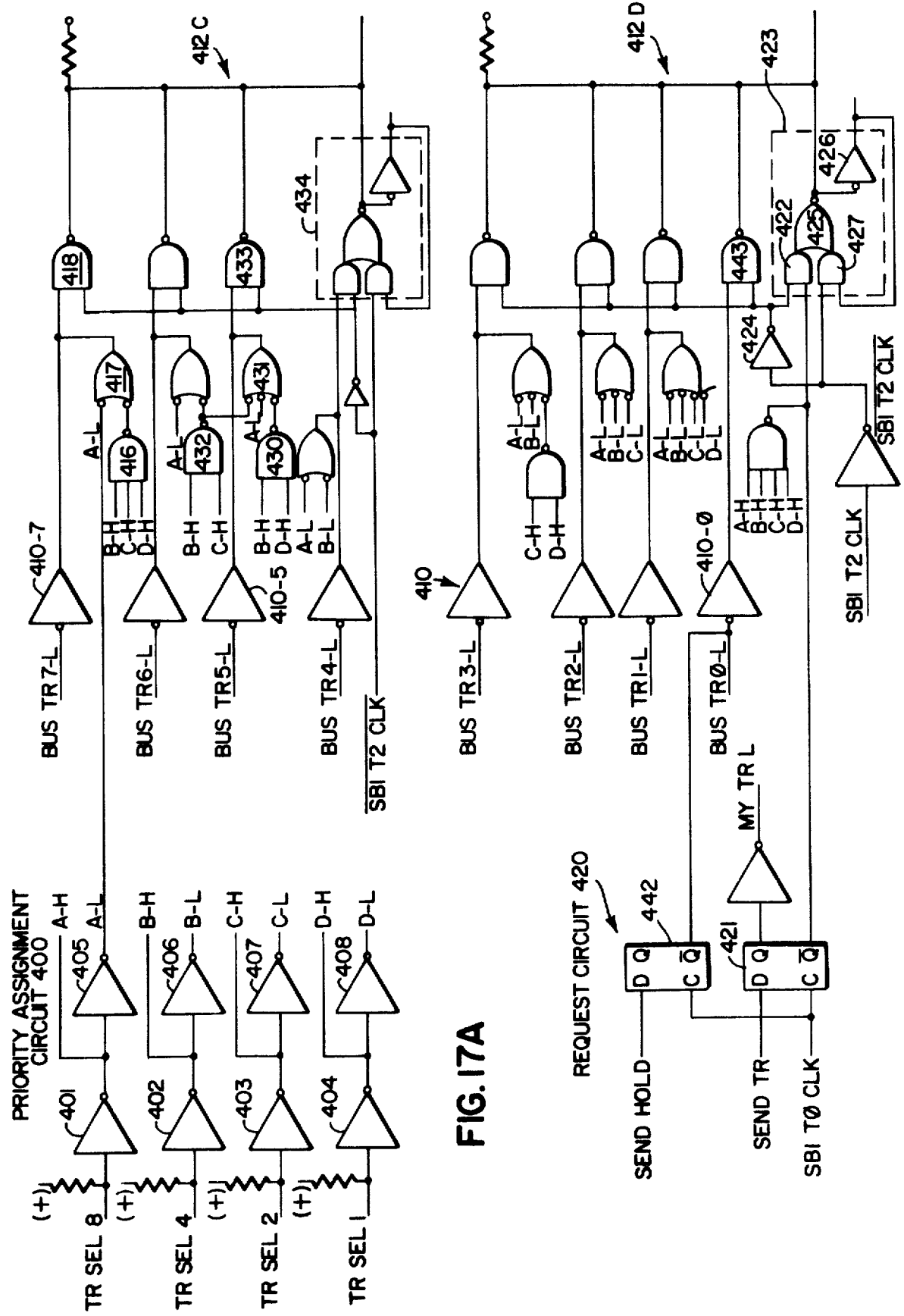

| SBI LEVEL OF NEXUS | | TR SEL | | | |
|---|---|---|---|---|---|
| | | 8 | 4 | 2 | 1 |
| HI | 1 | H | H | H | H |
| | 2 | H | H | H | L |
| | 3 | H | H | L | H |
| | 4 | H | H | L | L |
| | 5 | H | L | H | H |
| | 6 | H | L | H | L |
| | 7 | H | L | L | H |
| | 8 | H | L | L | L |
| | 9 | L | H | H | H |
| | 10 | L | H | H | L |
| | 11 | L | H | L | H |
| | 12 | L | H | L | L |
| | 13 | L | L | H | H |
| | 14 | L | L | H | L |
| LO | 15 | L | L | L | H |
| IMPLIED | 16 | L | L | L | L |

MEMORY INITIALIZATION CIRCUIT

CROSS REFERENCE TO RELATED PATENTS AND PATENT APPLICATIONS

This application is a continuation-in-part of U.S. patent application Ser. No. 845,417 filed Oct. 25, 1977, now abandoned, and assigned to the same assignee as the present invention.

U.S. Pat. No. 3,614,740 issued Oct. 19, 1971 for a DATA PROCESSING SYSTEM WITH CIRCUITS FOR TRANSFERRING BETWEEN OPERATING ROUTINES, INTERRUPTION ROUTINES AND SUBROUTINES and assigned to the same assignee as the present invention.

U.S. Pat. No. 3,614,741 issued Oct. 19, 1971 for a DATA PROCESSING SYSTEM WITH INSTRUCTION ADDRESSES IDENTIFYING ONE OF A PLURALITY OF REGISTERS INCLUDING THE PROGRAM COMPUTER and assigned to the same assignee as the present invention.

U.S. Pat. No. 3,710,324 issued Jan. 9, 1973 for a DATA PROCESSING SYSTEM and assigned to the same assignee as the present invention.

U.S. Pat. No. 3,999,163 issued Dec. 21, 1976 for a SECONDARY STORAGE FACILITY FOR DATA PROCESSING SYSTEM and assigned to the same assignee as the present invention.

U.S. patent application Ser. No. 845,055 filed Oct. 25, 1977 for a CENTRAL PROCESSOR FOR PROCESSING VARIABLE LENGTH INSTRUCTIONS, now abandoned, and assigned to the same assignee as the present invention.

BACKGROUND OF THE INVENTION

This invention generally relates to digital data processing sytems. More specifically it relates the interconnection of various units in such a system and the transfer of data among those units.

A digital data processing system comprises three basic elements: namely, a memory element, an input-output element and a processor element. The memory element stores information in addressable storage locations. This information includes data and instructions for processing the data. The processor element transfers information to and from the memory element, interprets the incoming information as either data or instructions and processes data in accordance with the instructions. The input-output element also communicates with the memory element in order to transfer input data to the system and to obtain processed data from it.

As the basic operating speeds of the various elements in data processing systems has increased, the use of dynamic memory elements has become more popular in data processing systems. The dynamic memories are popular because characteristic retrieval times for such memories are much faster than the characteristic retrieval times for core memory units. Moreover, in comparison to conventional core memories, dynamic memories are less expensive to purchase and build, require less power to operate and allow significantly more storage locations to be incorporated in a given area on a circuit board. However, the storage circuitry in dynamic memories is volatile so any data stored in those memory elements is lost if the power to the memory element is lost. To overcome any transient loss of power, these memories are supplied with a battery backup. However, there is still a possibility of loss due to decay of signals within the memory. Therefore, these memories also contain circuitry that periodically "refreshes" the contents of the memory. However, when the power to the computer is turned off, as is routinely done overnight, the refreshing circuitry is disabled and so, again, the information in the memory is eventually lost.

When power is initially applied to a data processing system, it is necessary to perform some preliminary operations that are established by a single "bootstrap" program or set of bootstrap programs. These programs contain a minimum number of instructions that will allow an input/output unit to operate as a console unit or to enable other programs stored in a disk memory to be retrieved with increasing complexity. Dynamic memory elements also must be initialized especially if they contain error correcting codes. Typically this memory initialization is accomplished by a memory initialization program or memory initialization hardware. The memory initialization is accomplished in either application by identifying each memory location in sequence and storing predetermined values in each location. However, all memory elements in a data processing system are not the same. Therefore, it is necessary to provide the initialization sequence with information concerning memory size and other similar information. When the initialization is performed with software, the booting programs are made more complex. Similarly, hardware complexity is increased when such hardware initialization circuitry is added with the systems.

Therefore, it is an object of this invention to provide an initialization circuit for a memory element which simplifies memory initialization.

Another object of this invention is to provide a memory initialization circuit for a memory element that utilizes simplified hardware circuitry and further simplifies a booting program.

SUMMARY

In accordance with this invention, all dynamic memory elements are initialized whenever control circuitry generates an initialization signal in response to a change in power status. All storage elements are then enabled in all memory elements to receive predetermined data in parallel. Within each storage element, however, the locations are identified in sequence utilizing addresses generated by refresh addressing circuitry.

This invention is pointed out with particularity in the appended claims. The above and further objects and advantages of the invention may be better understood by referring to the following detailed description taken in conjunction with the accompanying drawings.

BRIEF DESCRIPTION OF THE DRAWINGS

FIGS. 15A and 15B depict the clock generator circuitry shown in FIG. 6;

FIG. 16 depicts sequencing circuitry shown in FIG. 8 that responds to the circuitry in FIG. 15;

FIGS. 17A and 17B depict the circuitry that constitues one embodiment of the arbitration circuit shown in FIG. 8, and FIG. 17C is a chart that is useful in understanding the operation of that circuitry;

DESCRIPTION OF AN ILLUSTRATIVE EMBODIMENT

A. General Discussion (1) Data Processing System

Figure 1:
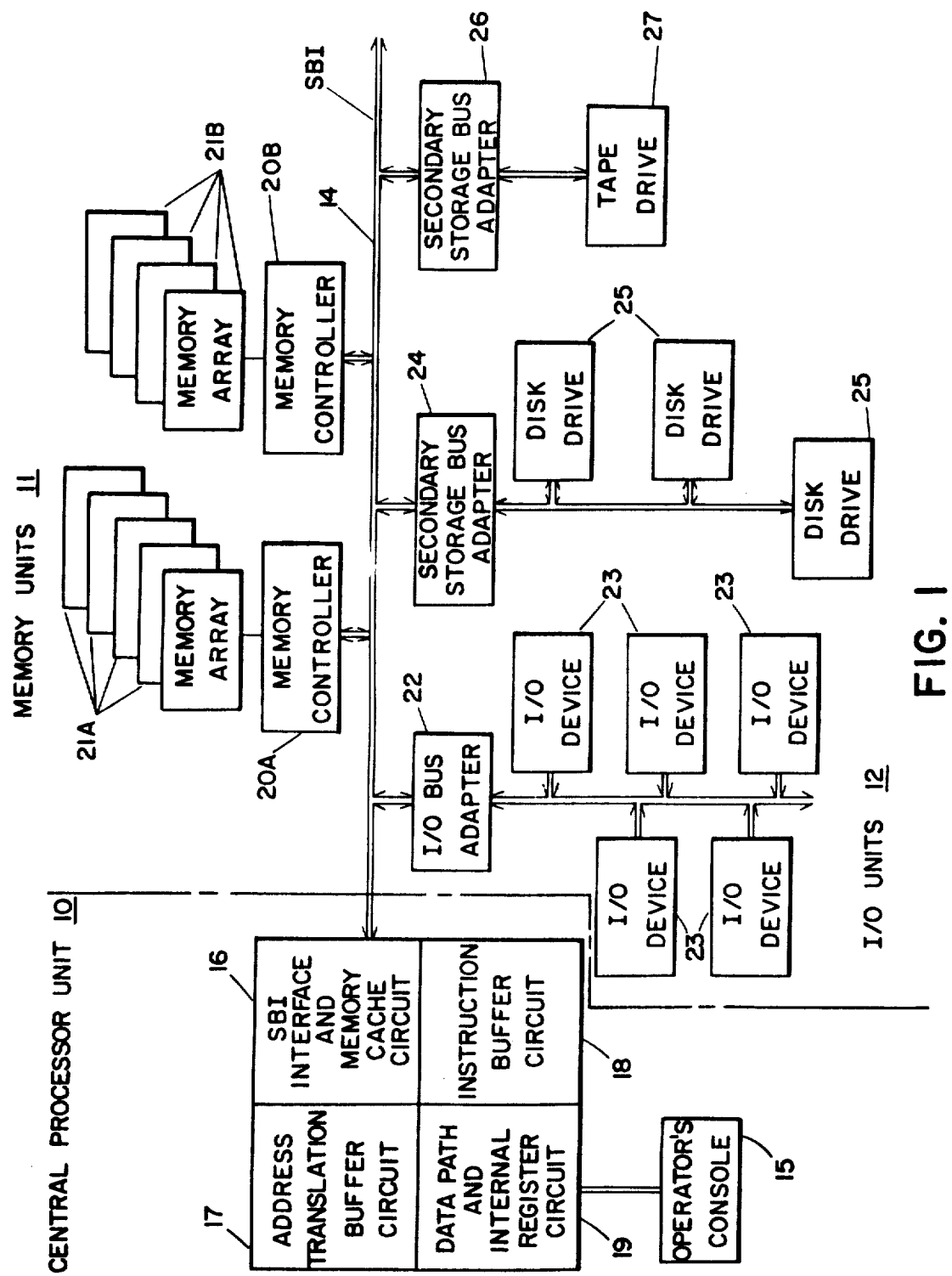
FIG. 1 is a block diagram of a digital data processing system constructed in accordance with this invention.

Referring to FIG. 1, the basic elements of a data processing system that embodies our invention comprises a central processor unit 10, memory units 11 and I/O units 12. A synchronous backplane interconnection (SBI) 14 interconnects the central processor unit 10, memory unit 11 and I/O units 12.

The central processor unit 10 comprises an operator's console 15, an SBI interface and memory cache circuit 16, an address translation buffer circuit 17, an instruction buffer circuit 18 and a data path and internal register circuit 19. The SBI interface and memory cache circuit 16 provides the necessary interfacing circuitry for transferring information over the SBI 14 to the memory units 11 and I/O units 12. The circuit 16 receives all data from the memory and all address translations from the buffer circuit 17. It includes an associative memory, or cache. Each time data is written into the cache memory in the circuit 16 from the data path and internal register circuit 19, that data is also written into a corresponding location in the memory unit 11.

This specific embodiment of the central processor 10 operates with virtual addresses. The address translation buffer circuit 17 converts the virtual addresses to physical addresses which the memory cache circuit 16 uses either to determine whether it contains data from the corresponding location or to initiate a transfer from the corresponding actual location in the memory unit 11. The instruction buffer circuit 18 includes means for storing instructions, or portions thereof, as they are retrieved either from the cache memory directly or from the memory unit 11.

The operator's console 15 serves as the operator interface. It allows the operator to examine and deposit data, halt the operation of the central processor unit 10 or step it through a sequence of program instructions. It also enables an operator to initialize the system through a bootstrap procedure and perform various diagnostic tests on the entire data processing system.

In FIG. 1, the memory units 11 comprise two memory controllers 20A and 20B. Each memory controller connects to a plurality of memory arrays. Specifically, memory controller 20A connects to memory arrays 21A while memory controller 20B connects to memory arrays 21B. The operation of the memory unit 11 is disclosed in detail later.

Several types of I/O units 12 are shown. An I/O bus adapter 22 interconnects various input/output(I/O) devices 23, such as teletypewriters, to the bus 14. The interconnection, operation and transfer of signals between the I/O bus adapter 22 and the I/O devices 23 is disclosed in U.S. Pat. No. 3,710,324.

Two other I/O units 12 provide a secondary storage facility for the data processing system. They include a secondary storage bus adapter 24 and a plurality of disk drives 25. There is also shown a secondary storage bus adapter 26 and a tape drive 27. The interconnection of the secondary storage bus adapters 24 and 26 and their respective disk drives 25 and tape drive 27 is disclosed in the foregoing U.S. Pat. No. 3,999,163.

As apparent from FIG. 1, the SBI 14 interconnects the various units in the data processing system. In accordance with this invention, the various circuits that connect to the SBI 14 interact over the SBI 14 in an extremely efficient manner. To understand the transfer of information between different pairs of units connected to the SBI 14, it will be helpful first to establish some definitions for terms that have already been used and that will be used throughout the remainder of this description.

"Information" is intelligence used to control and provide the basis for data processing. It includes address, data, control and status information. "Data" includes information which is the object of or result of processing.

Figure 2A:
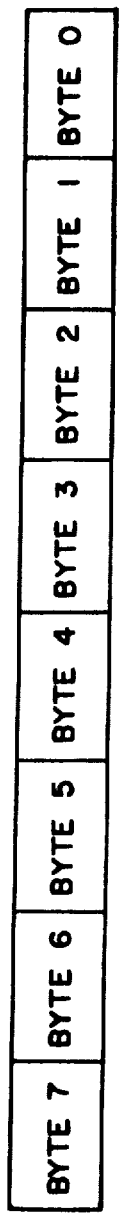
FIGS. 2A through 2D pictorially depict data types that are utilized in conjunction with a specific embodiment of this invention.
Figure 2B:
Figure 2C:
Figure 2D:
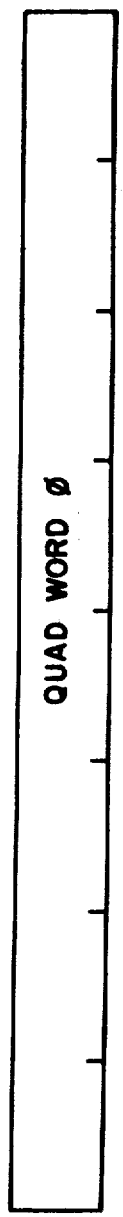

Transfers of information between units in the data processing system shown in FIG. 1 occur over the SBI 14 and involve transfers of discrete information items. Each information item has a characteristic size on the SBI 14. Other elements may process information items having other sizes. The most elementary information item is a byte. In one specific embodiment of the data processing system shown in FIG. 1, the byte includes eight binary digits (or bits). FIG. 2A depicts a number of contiguous bytes. The next larger data item size is a "word", as shown in FIG. 2B. A "word" comprises two contiguous bytes. As shown in FIG. 2C, two contiguous words constitute a "longword". Two contiguous longwords constitute a "quadword" as shown in FIG. 2D.

The SBI 14 transfers all the information as a longword in parallel. FIGS. 2A through 2D collectively illustrate four quadwords. In the quadword shown in FIG. 2A, byte 0 is in the least significant byte position while word 0 and longword 0 are in the least significant word and longword positions of FIGS. 2B and 2C respectively. The following discussion assumes that corresponding alignments are maintained within the data processing system. However, there is no requirement that any such alignments be maintained. Indeed, as described in co-pending U.S. application Ser. No. 845,055, transfers may occur without maintaining this alignment, as when a central processor unit transfers a longword beginning at some other byte boundary.

If two elements are to exchange information over the SBI 14, at least two "SBI transactions" are necessary. During a first SBI transaction, one element requests the information exchange and transmits command and address information onto the SBI 14. The other element, designated by the address information, responds and prepares to complete the information exchange. This completes a first SBI transaction. During a second SBI transaction the information to be exchanged passes over the SBI 14. A third SBI transaction for transferring still additional information is also possible.

Each element that connects to the SBI 14 is called a nexus. The specific system shown in FIG. 1 includes six nexuses. A nexus further is defined in terms of its function during an exchange of information. During such an exchange, the nexus that transmits command and address information onto the SBI 14 is called a "commander nexus". The unit which responds to that command and address information is called a "responder nexus". Thus, if the central processor unit needs to retrieve data from the memory controller 20A, the central processor unit becomes a commander nexus and transmits a read command and memory address during a first SBI transaction. The memory controller 20A becomes a responder nexus when it receives and accepts the command and address information from the SBI 14.

A nexus also is defined as a "transmitting" or "receiving" nexus. A transmitting nexus drives the signal lines while a receiving nexus samples and examines the signal lines during each bus transaction. In the foregoing example, the central processor unit is a transmitting nexus during the first SBI transaction and a receiving nexus during the second SBI transaction, Similarly, the memory controller 20A is a receiving nexus during the first bus transaction and a transmitting nexus during the second SBI transaction. Similar transactions occur for information exchanges between any two nexuses. However, the memory controllers normally function only as responder nexuses while central processor units normally function only as commander nexuses.

Typical information exchanges with the central processor unit 10 over the SBI 14 involve data to be interpreted in the central processor unit as instructions, operand specifiers and data. Other transfers will route data from the central processor unit back over the SBI unit 14 for transfer to other elements, or units, connected to the SBI 14.

Likewise, the other units shown in FIG. 1 can initiate information exchanges over the SBI 14. Typical exchanges would include transfers between one of the disk drives 25 or tape drive 27 and one of the memory units 11. The I/O devices 23 also communicate with the memory controllers 11.

Each of the memory controllers 20A and 20B and the bus adapters 22, 24 and 26 contain various control registers. At different times during the operation of the data processing system, programs being executed by the central processor 10 may transfer information directly to or from one of these control registers over the SBI 14 without involving the memory controllers 20A and 20B. All these transactions over the SBI 14, however, are basically the same because each control register that connects to the SBI 14 has a unique memory address. More specifically, the command-address information has the capability of addressing a predetermined number of memory locations. The maximum value of this number depends upon the number of bit positions in the address, and it defines the available memory space as a number of bytes. A portion of the available memory space is reserved for the storage locations in the memory arrays 21A and 21B. The remaining available space is reserved for these control registers. Thus, each storage location in the data processing system, whether it comprises a storage location in a memory array or a control register has a unique memory address.

This feature of the data processing system shown in FIG. 1 eliminates the need for input/output instructions. As a result, the SBI interface and memory cache circuit 16 or any other element connected to the SBI 14 can access any memory location using the same basic operations as it would if one of the memory units 11 were being accessed. Consequently, a description of information exchanges between the SBI interface and memory cache circuit 16 of the central processor unit 10 and the memory controller 20A and one of the memory arrays 21A in the memory units 11 essentially describes the information exchanges between any other units connected to the SBI 14. Variations or modifications required for a specific one of the adapters 22, 24 and 26 will be based upon the specific function of those adapters and will, based upon the following discussion, be apparent to anyone of ordinary skill in the art.

(2) The Synchronous Backplane Interconnect (SBI) 14

Figure 3:
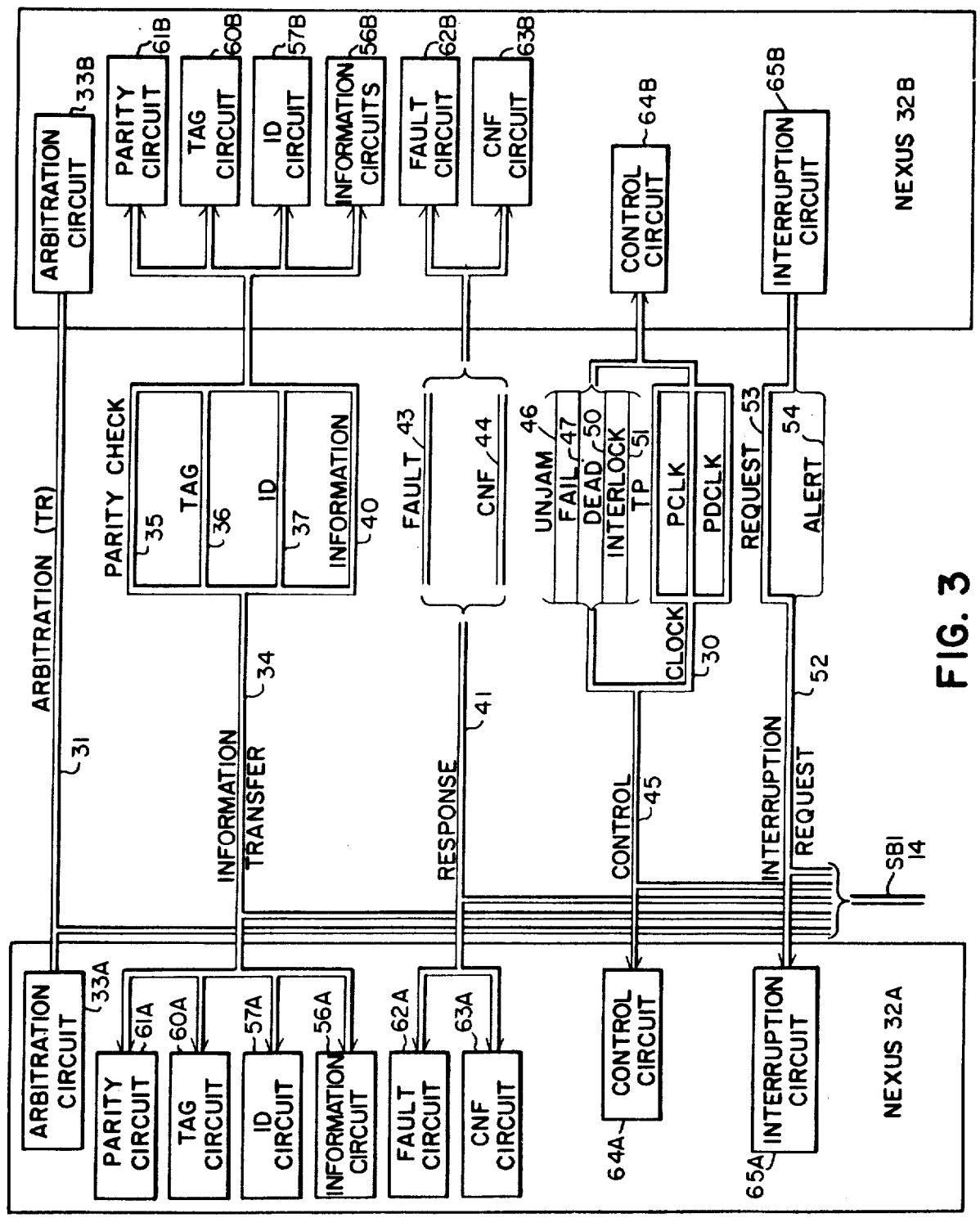
FIG. 3 illustrates the lines and corresponding signals that constitute an interconnection for elements in the digital data processing system in FIG. 1.
Figure 4:
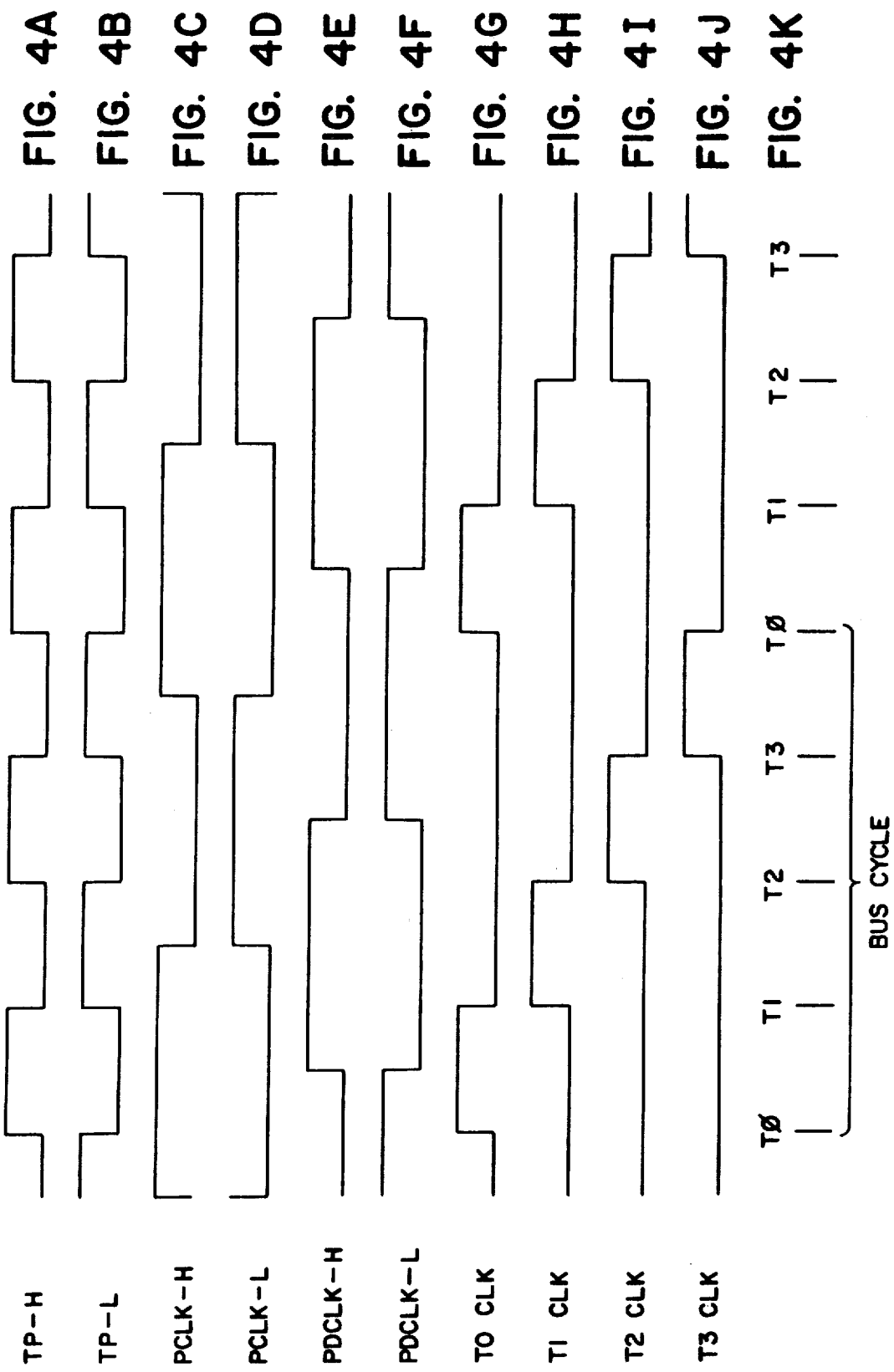
FIGS. 4A through 4K are charts that depict the various clocking signals and timing intervals that synchronize transfers of information between the elements shown in FIG. 1.

In accordance with one specific embodiment of this invention, the SBI 14 conveys a number of signals to and from the various units that connect to it over corresponding conductor positions. These conductor positions and signals can be listed in five classes:

1. arbitration;
2. information transfer;
3. response;
4. control;
5. interrupt request;

All these signals are maintained in synchronism with timing signals that constitute some of the signals on the control conductor positions. These timing signals are shown in FIG. 4. Specifically, a clocking circuit utilizes signals from a master clock (e.g., a clock generator 70 in FIG. 6) to generate a number of timing signals. FIGS. 4A and 4B depict complementary TP clocking signals that are designated as a TP-H signal and a TP-L signal respectively. The timing signals also include quadrature-phase signals at half the frequency of the TP signals. These are depicted as PCLK-H and PCLK-L complementary phase signals in FIG. 4C and 4D and complementary PDCLK-H and PDCLK-L phase signals in FIGS. 4E and 4F. The foregoing signals are clock signals that appear on conductors 30 of the SBI 14 shown in FIG. 3.

Each nexus includes circuitry for deriving the interval, or unit, timing signals that are necessary to perform transactions over the SBI 14. As shown in FIGS. 4G through 4J, these signals include T0 CLK through T3 CLK quadrature signals, each having a 25% duty cycle at half the frequency of the TP signals. The leading edges of the T0 CLK through T3 CLK pulses define T0 through T3 clocking times as shown in FIG. 4K. The time interval between successive T0 times defines a complete bus cycle and therefore is called a bus cycle time. Generally, a transmitting nexus transfers information onto the SBI 14 at a T0 clocking time during a given bus cycle. All receiving nexuses receive signals from the SBI 14 during the T2 clocking time and samples, or latches, those signals at a T3 time during the same bus cycle. In one specific embodiment of this invention, the interval between successive T0 times is about 200 nanoseconds. Specific circuitry for generating the timing signals and for decoding the timing signals is described later in more detail with respect to FIGS. 15A, 15B and 16.

As will now be apparent, each nexus that connects to the SBI 14 can transfer information over the SBI 14. Some means to control access to the SBI 14 must therefore be provided. The arbitration signals on ARBITRATION (TR) conductors, or lines, 31 in FIG. 3 provide this control function. Each nexus has a predetermined bus access priority assigned to it. In this specific embodiment, there are sixteen arbitration lines that are designated respectively as TR00 through TR15 lines. The TR00 signal constitutes a HOLD signal and connects to circuitry in each nexus. Each of the TR01 through TR15 lines has assigned to it a priority. The highest priority nexus transmits an access control signal on the TR01 line and the second lowest priority nexus transmits another access control signal on the TR15 line. The lowest priority nexus does not transmit any access control signal onto lines 31. Each nexus responds to access control signals from nexuses that have priorities that are higher than the priority assigned to that nexus and to the HOLD signal.

When a nexus other than the nexus having the lowest priority, such as the nexus 32 shown in FIG. 3, desires to gain access to the SBI 14, it conditions an arbitration circuit 33A to transmit its access control signal on its assigned TR line at a T0 time. At the next T3 time, the arbitration circuit 33A samples all the access control signals from higher priority nexuses and the HOLD signal. If such an access control signal or the HOLD signal is being transmitted, the nexus 32A continues sampling the access control signals at each successive T3 time until no access control signal from a higher priority nexus or the HOLD signal is received. When, at a T3 time, no such signals are received, the arbitration circuit 33A enables the information transfer circuit 56A to begin transmitting information transfer signals at the following T0 time during a next bus cycle in succession.

As previously indicated, the lowest priority nexus transmits no access control signal, but it receives all the access control signals and the HOLD signal. If this nexus wishes to gain access to the SBI 14, it can do so provided at a particular T3 time no access control signal is asserted and that the HOLD signal is not asserted. It is not necessary for this nexus to delay its first sampling of the TR lines. Consequently, this nexus actually has shortest access time to the SBI 14. For the reason the central processor unit 10 normally is assigned the lowest priority in the digital data processing system. An embodiment of a specific arbitration circuit is described later with respect to FIGS. 8, and 17A through 17C.

The information transfer signals and their corresponding lines 34 are grouped in four subgroups. They include (1) parity check lines 35, (2) information tag (TAG) lines 36, (3) identification (ID) lines 37, and (4) information lines 40.

There are two parity check lines 35. A P0 line carries a parity signal for the signals on the tag lines 36, ID lines 37 and mask lines in the information lines 40. A P1 line carries parity for the signals on the other information lines 40.

The tag signals are generated by a tag circuit 60A in the transmitting nexus. They control the interpretation of the signals on the ID lines 37 and the information signals 40 by ID and information circuits 57B and 56B. There are four general types of information that are carried over the information lines 40. They include read data, command-address, write data and interrupt summary read information. A set of tag bit values that correspond to each of these types control the interpretation given to the mask signals on the information lines 40 by the information circuit 56B. For example, if the tag signals specify that the information is data that has been read from some location, the mask bits can be interpreted to indicate whether the data is actual data, corrected data or substituted data. When the tag bits specify that the information on the information lines 40 constitutes data to be written into some location, the mask bits specify which of four bytes in the addressed longword location will be written.

When the tag bit value specifies that the information of the information lines 40 constitutes a command and address, the information is divided into two fields. A first field is a function field; the second, an address field. The function field specifies different types of reading and writing operations to be performed by the designated responding nexus. The mask bits may or may not be used with individual ones of these operations.

There are six basic operations which the function field can define; and they include (1) a masked reading operation, (2) an interlocked masked reading operation, (3) an extended reading operation, (4) a masked writing operation, (5) an interlocked masked writing operation and (6) an extended masked writing operation. With the exception of the extended reading operation, all these operations utilize the information in the mask field.

Figure 20:
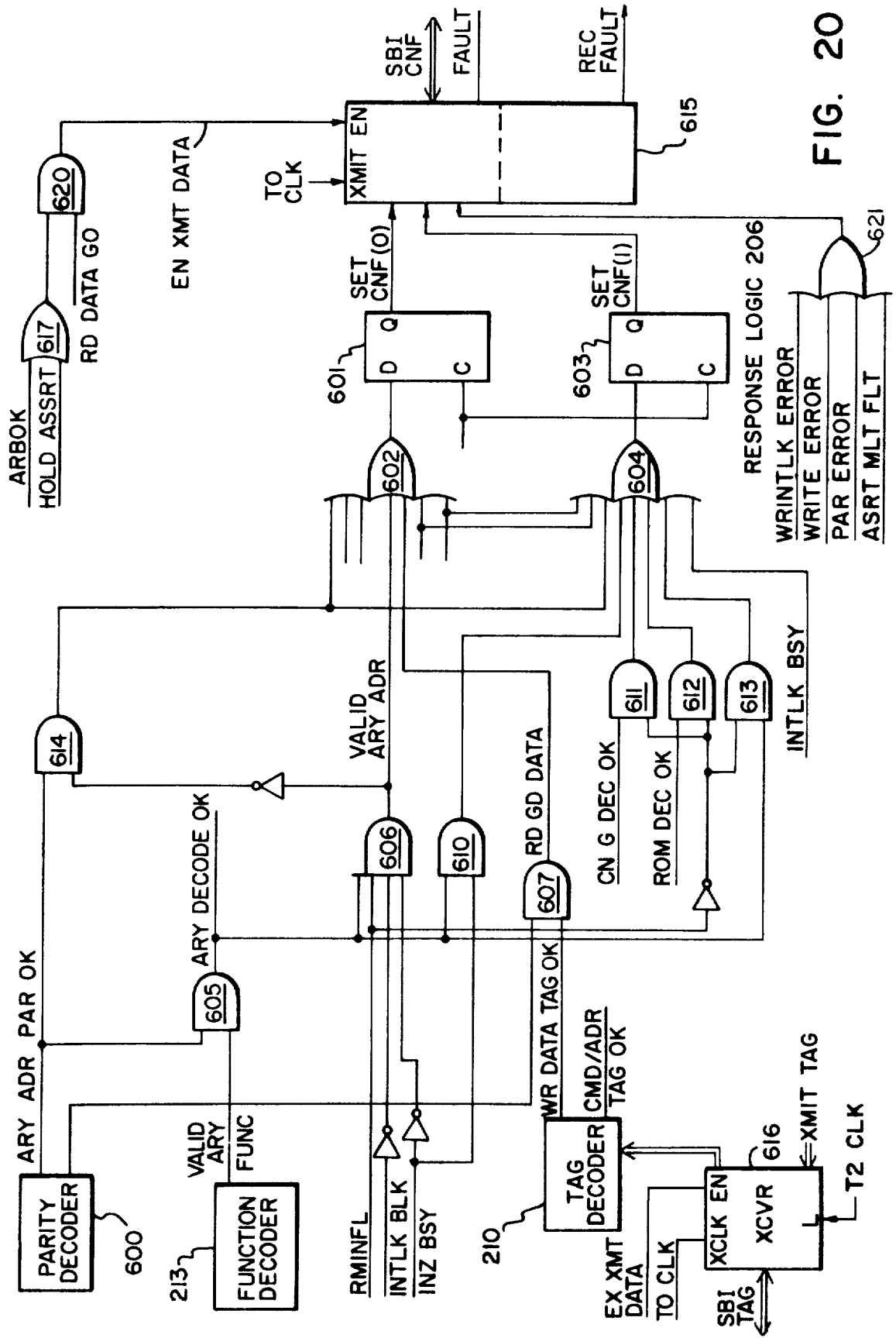
FIG. 20 is a logic diagram of response circuitry associated with the circuit shown in FIGS. 11 and 12.
Figure 21:
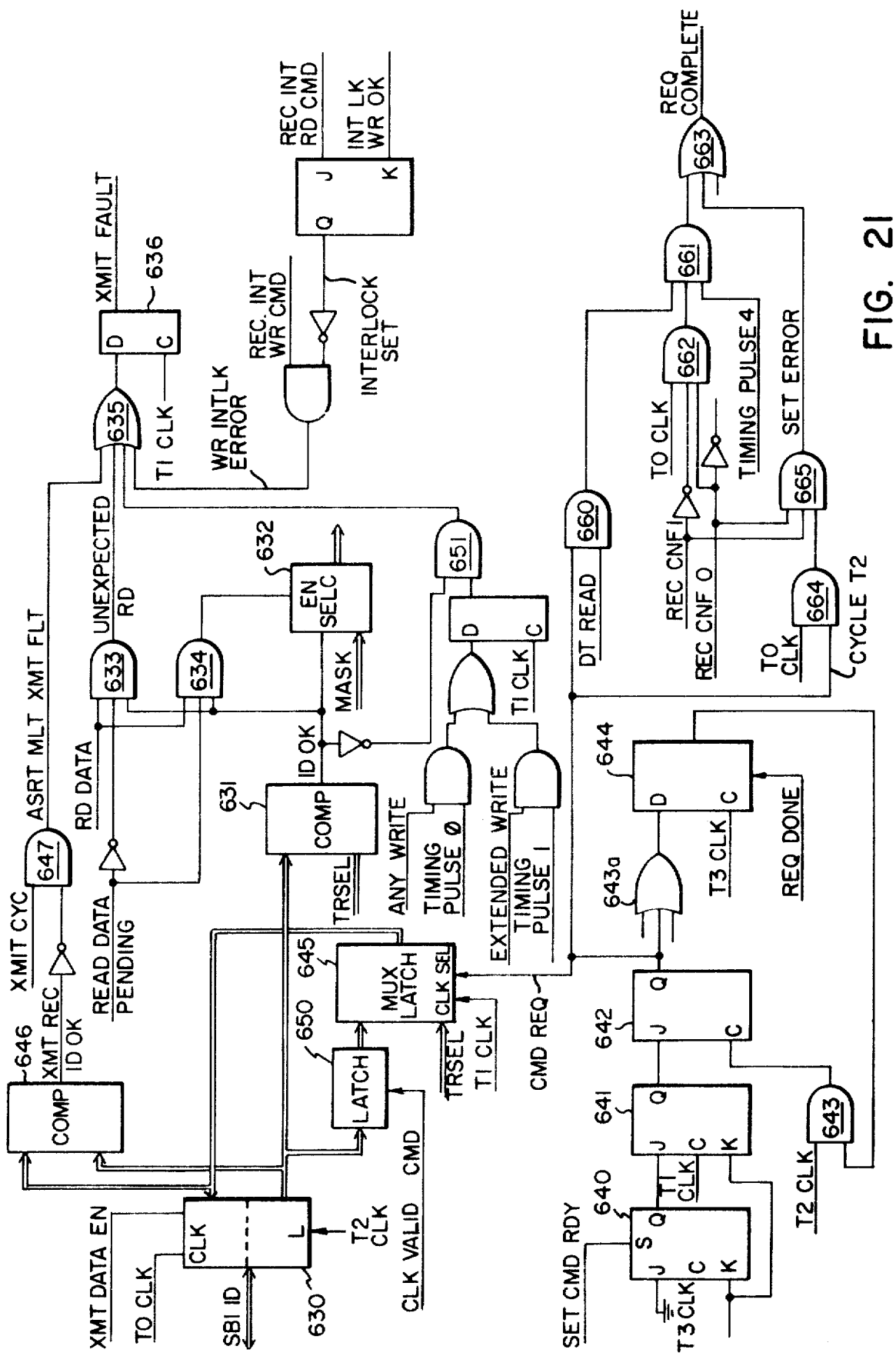
FIG. 21 is a logic diagram of identification and response circuitry that is located in a nexus.

Response lines 41 include a fault line 43 and two CNF lines 44. Corresponding circuitry is shown in FIGS. 20 and 21. Generally, however, a transmitter nexus transmits information on the SBI 14 during a bus cycle. Then one receiving nexus decodes the address and, two bus cycles later, transmits a confirmation of the proper receipt of that information. Each nexus samples the signals on the SBI at the T3 time of each successive bus cycle. Therefore, each transmitting nexus must include circuitry for distinguishing those confirmation signals that are in response to each of its transmissions.

The confirmation lines 44 may define one of four states: namely an unasserted state that indicates no response or selection; an acknowledge (ACK) state as a positive acknowledgment to a transfer; a busy state in response to a successful selection of a nexus that is presently unable to respond further to the command; and an error state when a successful selection of a nexus has been made but the nexus cannot execute that type of command.

The FAULT line 43 carries a FAULT signal that indicates whether any information path parity error, write sequence error or other error conditions exist.

Control lines 45 include the the clock lines 30 as well as four other control lines.

An UNJAM line 46 in the control lines 45 carries a signal from the central processor unit 10 that establishes an initial condition in all the other elements and the UNJAM signal thereby constitutes a system initializing signal.

A FAIL signal on line 47 is asserted by a nexus if it is an essential element in the data processing system and its power is failing. The central processor unit 10 is the only nexus that recognizes a FAIL signal.

A DEAD signal on line 50 is asserted whenever an impending power failure in the clocking or SBI terminating networks is detected. It is equivalent to a DC LO signal in a data processing system.

An INTERLOCK signal on line 51 coordinates various nexuses responding to interlocked reading and writing operations. When a commanding nexus transmits information including an interlocked reading command during a first bus cycle, it transmits the INTERLOCK signal during the next bus cycle. A responding memory nexus transmits the INTERLOCK signal during the succeeding bus cycle. It will continue to transmit the INTERLOCK signal until it receives an interlocked masked writing command and transmits a corresponding a positive confirmation. The INTERLOCK signal then is terminated.

A final group of lines 52 carries INTERRUPT REQUEST signals. These signals are generated by nexuses which must signal the central processing unit 10 to respond to some condition, such as the completion of a data transfer by one of the secondary storage bus adapters 24 or 26 in FIG. 1. The INTERRUPT REQUEST lines 52 are asserted in synchronism at the T0 time. When the central processor unit 10 responds to an INTERRUPT REQUEST signal, it transmits an interrupt summary read command that designates one interrupt request line. A nexus that receives the interrupt summary read command and is asserting the corresponding interrupt request line transmits ONES in the preassigned bit positions of the longword in the information field at the same time that it transmits its CNF signals. No other signals are transmitted. These signals uniquely identify the requesting nexus and enable the central processor unit 10 to respond. No other transactions can occur over the SBI during such a transaction because the central processor unit 10 asserts the HOLD signal on the TR00 line for both the bus cycle during which it transmits the interrupt summary read command and the following bus cycle. The central processor unit 10 then can respond to the condition that caused the interrupt.

If a nexus does not contain an interrupt mechanism, such as the memory controller 20A, it may still be necessary to alert the central processing unit 10 to some change in its condition. If such a change occurs, such a nexus generates an ALERT signal on the line 54. The central processing unit 10 responds to the ALERT signal.

Figure 5:
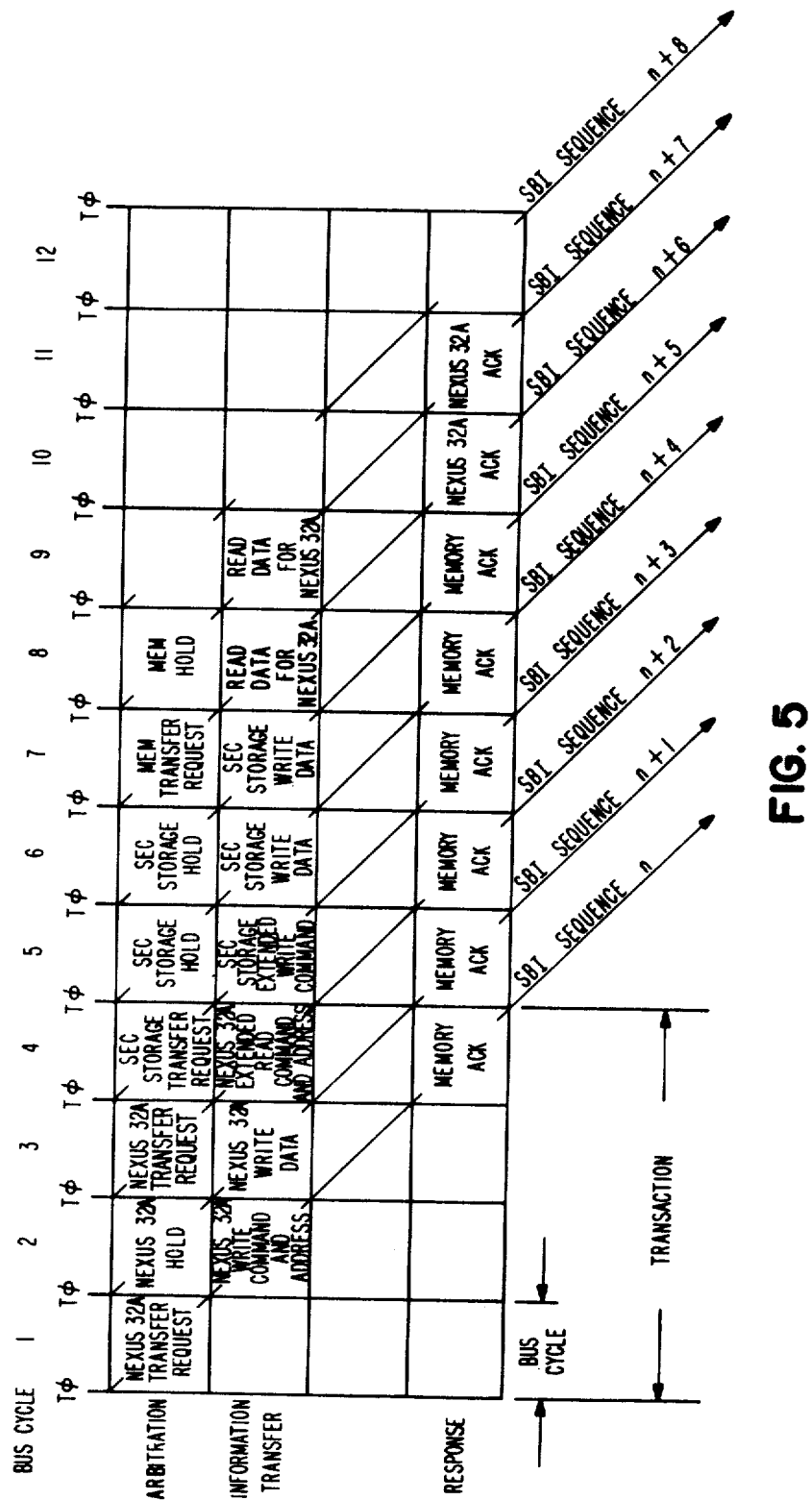
FIG. 5 is a diagram that depicts sequences of transactions that can occur between the elements shown in FIG. 3.

With this knowledge of the various signals that are transmitted over the SBI 14, it will now be possible to use FIGS. 3 and 5 to describe generally several SBI transactions that illustrate the efficiency of a data processing system utilizing elements that connect to the SBI 14. The SBI 14 is a time-division multiplexed interconnection. As apparent from the foregoing discussion, a memory exchange involves at least two transactions. A first transaction involves the transfer of command and address information; a second and any following transactions involve the transfer of data. The same lines are used for all transactions, and the meaning given to the information on the information lines 40 during each transaction is determined by the signals on the tag lines 36.

FIG. 5 depicts several sequences that might occur between several nexuses including the nexus 32A and the nexus 32B, assuming that the nexus 32B includes one of the memory controllers. The nexus 32A could be the I/O bus adapter 22 or one of the secondary storage bus adapters 24 and 26.

Initially, the arbitration circuit 33A receives a signal from other circuitry indicating that the nexus 32A is prepared to transfer data to the nexus 32B. At each T3 time thereafter, the arbitration circuit 33A samples the arbitration lines until it receives control of the SBI 14. In FIG. 5 the arbitration circuit 33A samples the arbitration lines 31 and finds no access control signal of higher priority or the HOLD signal on the TR lines at the T3 time during bus cycle 1.

At the completion of the bus cycle 1, circuitry including the information circuit 65A and ID circuit 57A, a tag circuit 60A and a parity circuit 61A transmits, during bus cycle 2, appropriate signals onto information transfer lines 34 at the T0 time and all nexuses sample the information at the T3 time. These include write command signals and address signals from the information circuit 56A for identifying a location in the information circuits 56B, signals identifying the nexus 32A from the ID circuit 57A and signals from the tag circuit 60A specifying that the information lines 40 have command and address information. The parity circuit 61A generates the appropriate parity. If the writing command is to be followed by data, called "write data", during the next bus cycle, the arbitration circuit 33A also transmits the HOLD signal on the TR00 line during bus cycle 2 thereby to prevent any higher priority nexus from assuming control over the information transfer lines 34 during bus cycle 3. During bus cycle 3, nothing occurs with respect to SBI sequence "n". On the second following bus cycle (i.e., bus cycle 4), a CNF circuit 63B in the nexus 32B transmits a positive confirmation (designated as a MEMORY ACK) over the CNF lines 44, assuming that the information received during bus cycle 2 by the nexus 32B was without error. This completes SBI sequence "n" for transferring a masked or interlocked masked writing command and address; this transaction required four consecutive bus cycles. During bus cycle 3, the nexus 32A stops transmitting the writing command and address information and transmits, from the information circuit 56A, the write data. After the nexus 32B receives the write data at the T3 time during bus cycle 3, it waits bus cycle 5 to transmit the corresponding MEMORY ACK. This completes SBI sequence "n+1". The responding nexus modifies only the byte positions specified by the byte mask transferred with the command and address.

From the foregoing description it will be apparent that the writing operation requires two separate transactions. Moreover, each transaction requires four successive bus cycles. However, the sequencing and timing of the transactions of the SBI 14 reduces the duration of this writing operation to five bus cycles, rather than eight.

If the nexus 32A were prepared to issue an extended reading command and no other nexus of higher priority were transmitting its access control signal and the HOLD signal were not being transmitted during bus cycle 3, the nexus 32A could transmit the command and address information on the information transfer lines 34 during bus cycle 4. The MEMORY ACK confirmation for this transaction, bus sequence, "n+2" in FIG. 5, would not be sampled at the commander nexus 32A until bus cycle 6. An extended reading operation causes responder nexus 32B to obtain a quadword beginning at the location specified by the address signals. However, a quadword includes two longwords, and the information lines 34 only transfer one longword in parallel. Thus, the nexus 32B interprets the extended reading command and prepares to perform two successive transactions on the SBI 14.

At this point, it would be possible to inhibit any further transactions over the SBI 14 by any other nexus. However, in accordance with this invention, the nexus 32A relinquishes its control of the SBI 14, so another nexus can take control. This release enables a secondary storage element, for example, to control the SBI 14 and transmit an extended writing command during bus cycle 5. As described later, this command normally will specify one of the memory controllers 20A and 20B in FIG. 1. If it were directed to the same memory controller that received the extended reading command, the memory controller 20A would still accept the command and subsequently accept the transmitted write data because each memory controller contains a command file which stores successive commands and write data items that are transferred to it. It is described later.

As previously indicated, any writing operation may be followed in successive bus cycles with the write data to be written, so the secondary storage element, as a commander nexus, asserts the HOLD signal during bus cycles 5 and 6 and transmits the write data during bus cycles 6 and 7. Thus, an extended writing operation requires three successive transactions that are shown as bus sequence "n+3" through "n+5" in FIG. 5. However, they extend only over an interval of six bus cycles.

Assuming that upon the completion of the transfer of the writing command and address information and the write data, the nexus 32B were ready to reply to the prior extended reading command, it would be in a position to take control of the bus and transmit the first read data item onto the information transfer lines during bus cycle 8 as part of SBI sequence "n+6". As an extended reading operation is being performed, the nexus 32B asserts the HOLD signal during bus cycle 8 to guarantee that it can send the second read data item during SBI sequence "n+7". Again, every nexus receives the information on the SBI 14, but the nexus 32A decodes its ID code on the ID lines 37 and the read data function on the tag lines 35. It then accepts the read data items at the T3 times during bus cycles 8 and 9. The nexus 32A transmits its confirmation, depicted as a NEXUS 32A ACK in FIG. 5, over the CNF lines 44 during bus cycles 10 and 11. As described later, the nexus 32B then "knows" that no transmission error conditions exist except that a memory controller does not necessarily respond to these signals.

From the foregoing description, it can be seen that the circuitry shown in FIG. 3 and the operation in FIG. 5 enable transfers over the SBI to be conducted very efficiently. As can be seen by looking at any specific one of the bus cycles 1 through 11, different groups of lines that constitute the SBI 14 are involved with different bus sequences or transactions at the same time. For example, during bus cycle 6 the HOLD signal is asserted for bus sequence "n+5". Simultaneously, the information transfer lines 34 are conveying the write data for SBI sequence "n+4", and the response lines 41 are conducting confirmation signals for SBI sequence "n+2". Moreover, the control of the SBI 14 enables eight transactions, that each require four bus cycles to complete, to be completed within 11 bus cycles, rather than thirty-two bus cycles. It is the foregoing timing and sequencing of signals on the SBI which enable it to transfer data among the elements in a digital data processing system in a highly efficient manner.

Although the extended reading operation begun in bus cycle 3 was not completed until bus cycle 11, the associated release of the SBI 14 allowed a completely different transaction during bus cycle 5. The reading operation therefore did not inhibit other transfers over the SBI 14 while the nexus 32B was retrieving the read data. It was only when the nexus 32B had the data items ready for transfer that it took control of the SBI 14.

(3) Central Processor Unit 10

Figure 6:
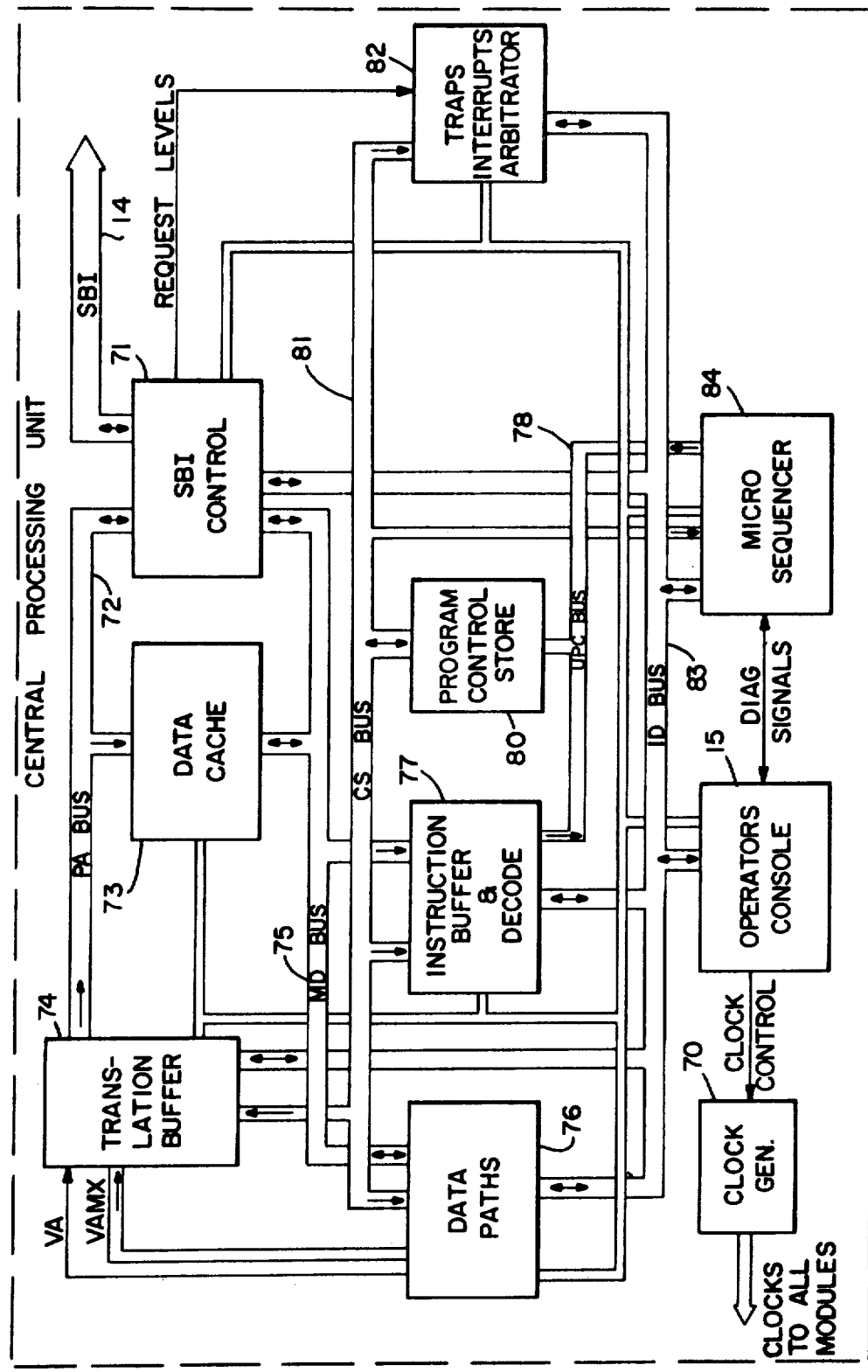
FIG. 6 is a detailed block diagram of the central processor unit 10 shown in FIG. 1.

As shown in FIG. 6, the central processor unit 10 includes the operator's console 15, the SBI 14 and the other circuits that constitute the SBI interface and memory cache circuit 16, the address translation buffer circuit 17 and the instruction buffer circuit 18 of FIG. 1. More specifically, the central processor unit 10 operates under timing established by a clock generator 70 that the TP, PCLK and PDCLK clocking signals, shown in FIG. 4, that are transmitted onto the SBI 14 from which internal processor timing is derived. The SBI interface and memory cache circuit 16 comprises an SBI control circuit 71 that connects to the SBI 14 and to a physical address (PA) bus 72. The PA bus 72 connects to a data cache circuit 73 and to a translation buffer 74. The translation buffer 74 converts virtual address (VA) information and other control information into a physical address that is transmitted simultaneously to the SBI control 71 and data cache 73. Data from the data cache 73, or from any other location on the SBI 14 that passes through the SBI control 71, is conveyed to other elements in the central processor unit 10 over a memory data (MD) bus 75. These units include a data paths circuit 76 and an instruction buffer and decode circuit 77.

A microprogram control (UPC) bus 78 conveys signals from the instruction buffer and decode circuit 77 to a program control store 80. The program control store 80 then generates various control signals onto a CS bus 81, and this bus conveys signals to the translation buffer 74, the data paths 76, the instruction buffer and decoder 77 and a traps-interrupts arbitrator circuit 82. These circuits and the operator's console 15 communicate over an instruction data (ID) bus 83 with a microsequencer 84 that controls the sequence of operations in response to microinstructions stored in the program control store 80.

The microsequencer 84 establishes a retrieval state for obtaining an instruction. A program counter, which specifies the address of the next instruction to be retrieved from one of the memory units 11, passes information from data paths circuit 76 through the translation buffer 74 onto the PA bus 72. If the data cache 73 contains valid information in a location corresponding to the specified physical address, it transmits data over the MD bus 75 to the instruction buffer and decode circuit 77. The microsequencer 84 establishes other data paths that transfer other information to the translation buffer 74 thereby to transfer other data into registers in the data paths circuit 76 from either the data cache 73 or, after a retrieval from the memory units 11 or other memory locations on the SBI 14, the SBI control 71. If the instruction requires data to be transferred to a physically addressed location, the microsequencer 84 establishes the data paths that are necessary to transfer signals to the translation buffer 74 thereby to form the physical address and to transfer the data simultaneously to the data cache 73 and to the SBI control 71. During any such transfer the SBI control 71 initiates an exchange with the specified memory location.

Figure 7:
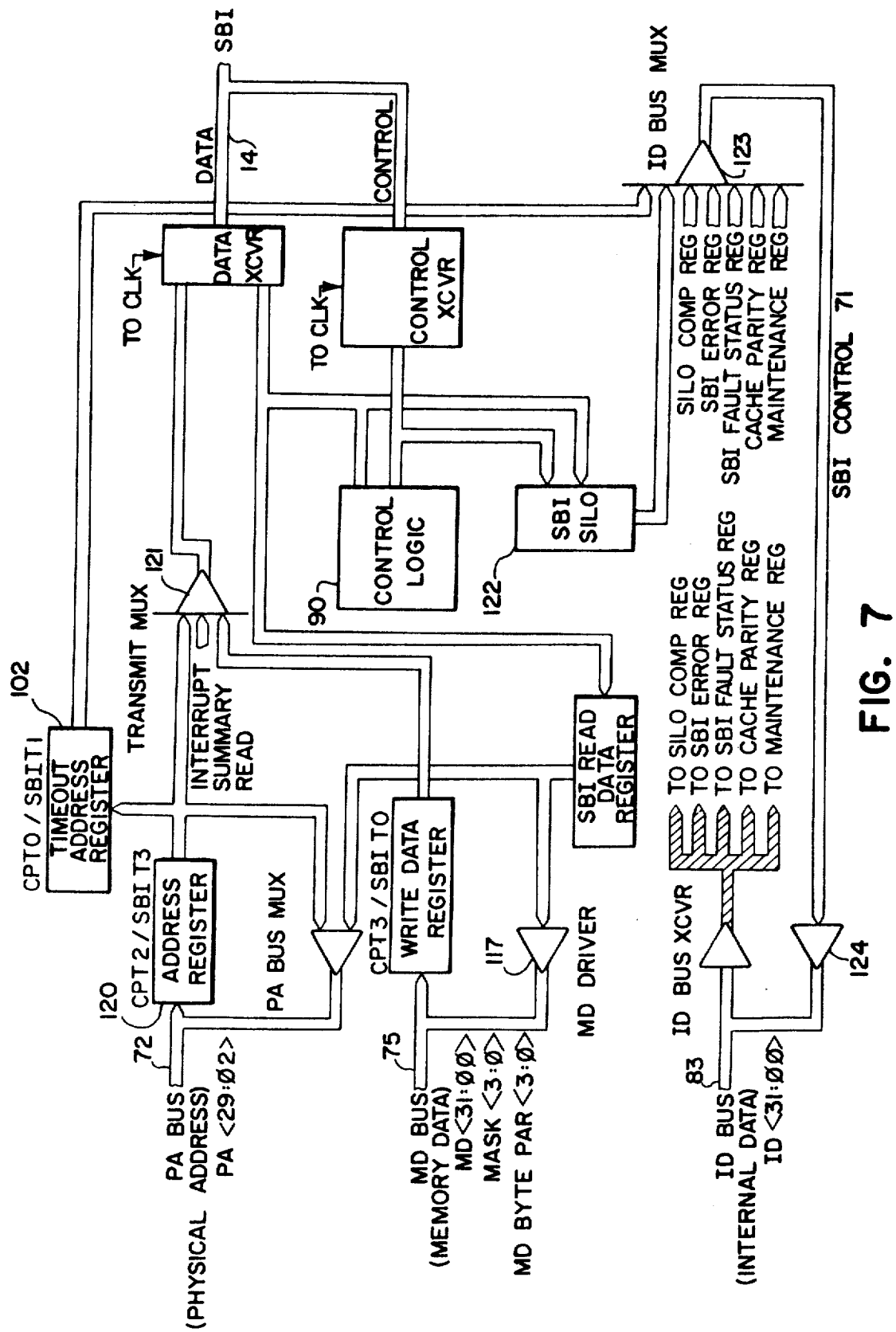
FIG. 7 is a block diagram of the data paths within the SBI control shown in FIG. 6.
Figure 9:
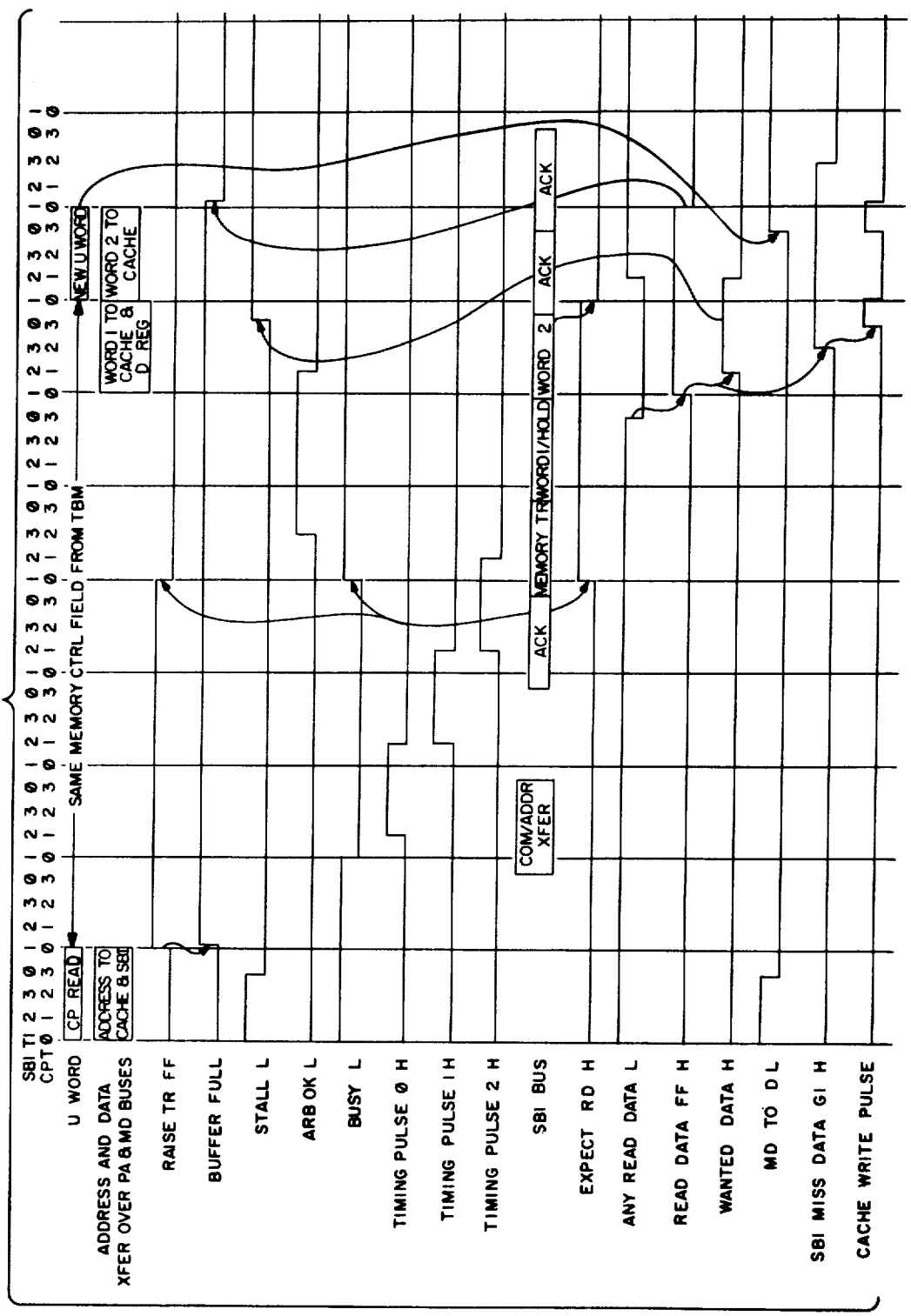
FIG. 9 is a timing diagram that is useful in understanding the operation of the SBI control shown in FIGS. 6 through 8 during a reading operation.
Figure 10:
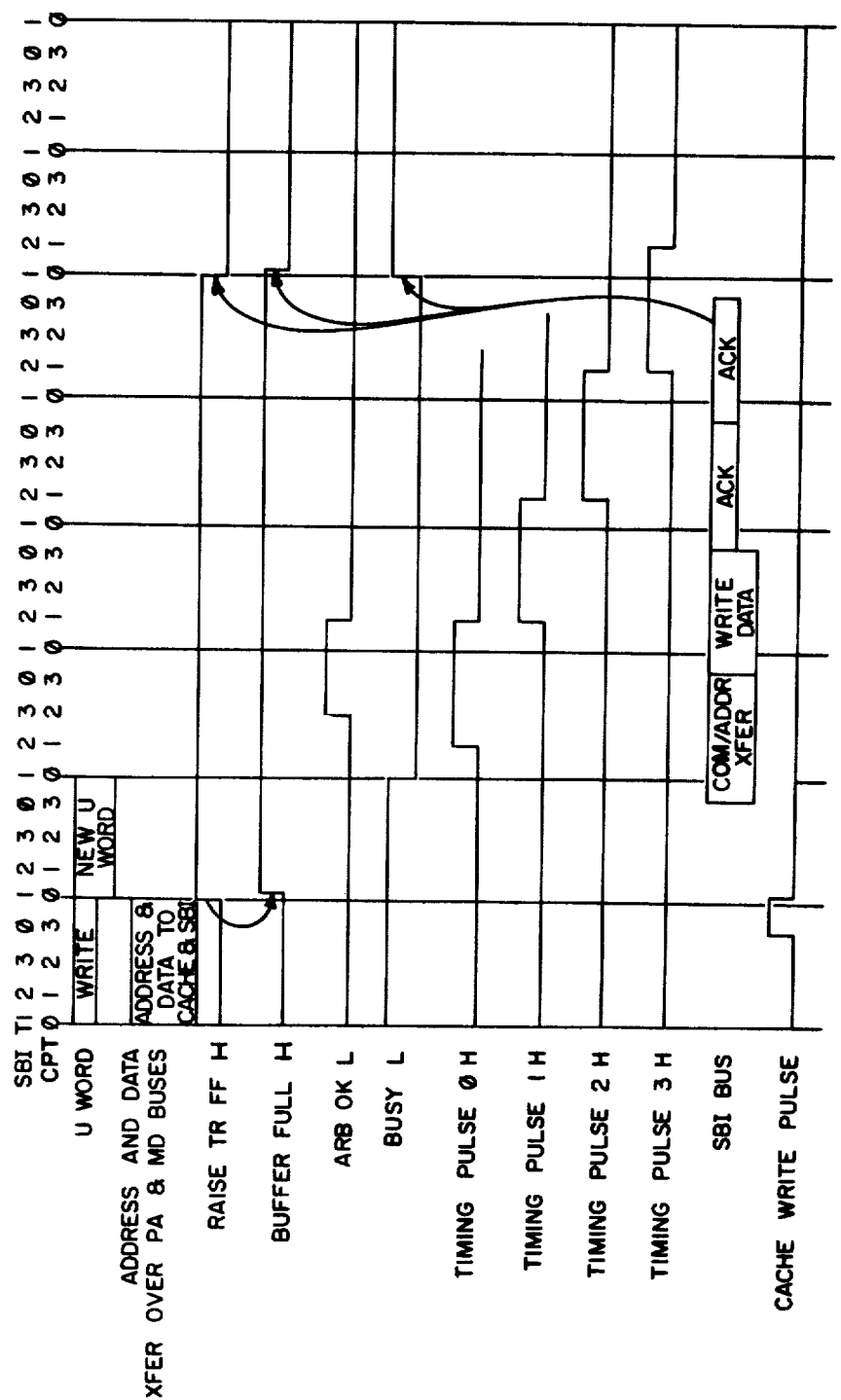
FIG. 10 is a timing diagram that is useful in understanding the operation of the circuitry shown in FIGS. 6 through 8 during a writing operation.

As shown in FIGS. 6 and 7, the SBI control 71 connects to the PA bus 72, the MD bus 75, the ID bus 83 and the SBI 14. The general relationship between the timing of the central processor unit 10 and of the SBI 14 is shown in FIGS. 9 and 10. In the following discussion, the prefix "SBI" designates SBI times; the prefix "CP", central processor unit times. FIG. 9 discloses cycle times bounded at CPT0 times.

During a first cycle time, the microword from the microsequencer 84 produces a reading signal and places the physical address on the PA bus 72. If the data cache does not contain the information, a "miss" condition exists. A read-write condition circuit 91, shown in FIG. 8, asserts a STALL signal that conditions a RAISE TR flip-flop 92 to be set at a next SBIT1 time. This signal is shown as a zero, or ground, assertion signal in FIG. 9. After a short time delay, an OR gate 93 generates a BUFFER FULL signal which can also be generated in response to other signals such as the assertion of a READ DATA FF signal by flip-flop 94 when the nexus is in a receiving mode or an EXPECT READ signal from a shift register 95 after a read data item has been received. So long as a BUSY flip-flop 96 is cleared, the RAISED TR signal energizes an AND gate 97 and an OR gate 100 thereby to generate a RAISE TR signal.

Figures 17B, 17C:
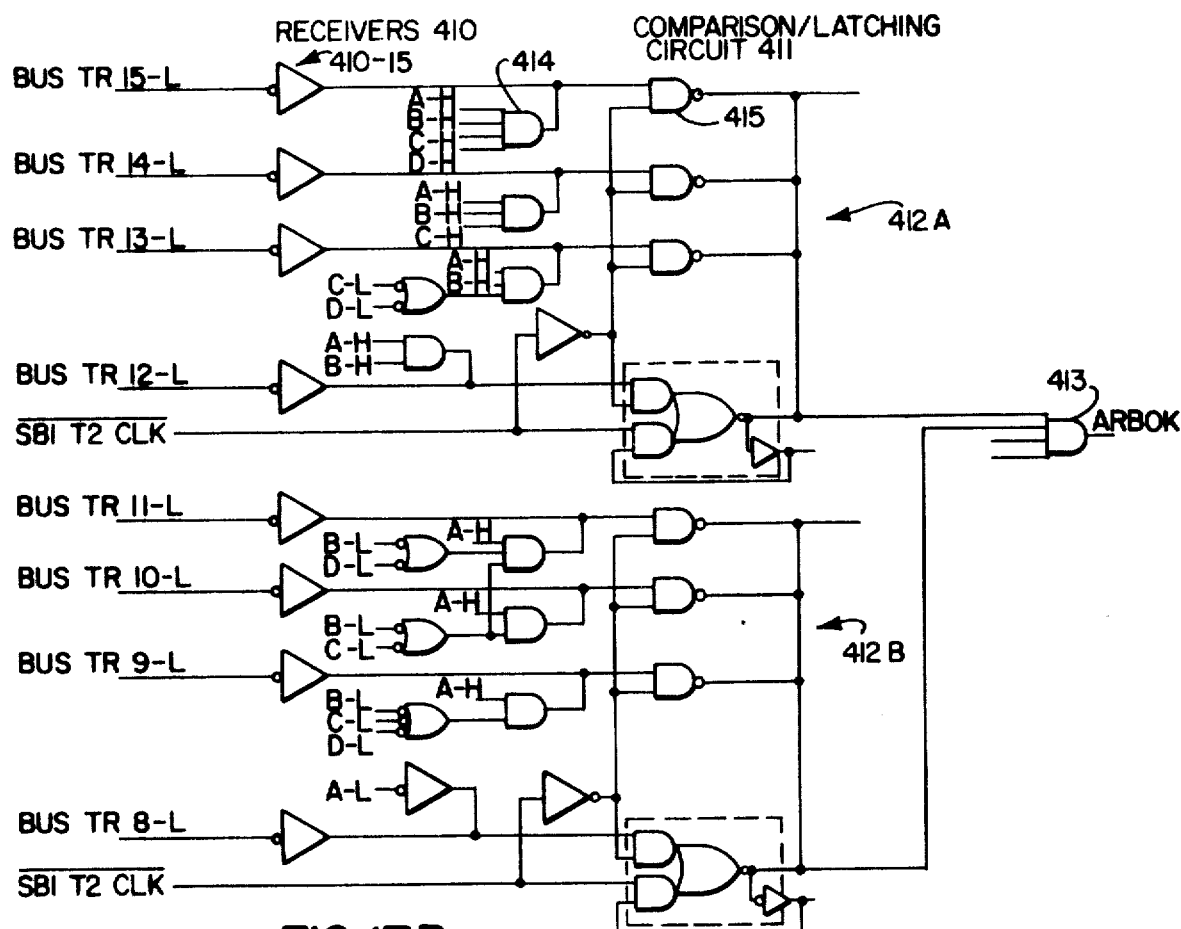

A priority arbitration circuit 101 that is shown in detail in FIGS. 17A and 17B, asserts an ARB OK signal at an SBIT3 time so long as (1) no incoming higher priority access control or HOLD signals on the TR lines are asserted, (2) the AND gate 102 was energized by the RAISE TR signal from the OR gate 100 and (3) the ARB OK signal was not then asserted. The arbitration circuit 101 receives the incoming signal from the AND gate 102 and shifts the MY TR signal on the SBI N at the leading edge of a T0 CLK pulse (i.e., the SBI T0 time).

When the arbitration circuit 101 determines that the MY TR signal has the highest priority, it asserts an ARB OK signal at the T3 time. At the trailing edge of the T2 CLK pulse (i.e. SBI T3 time) a latch 103 is set if the RAISE TR signal is asserted thereby to energize an AND gate 104 and generate a TRANSMIT CA signal. The TRANSMIT CA signal indicates that command-address information is to be sent, and this signal is applied to several other circuits. For example, this signal controls the transfer of the address from an address register 120 in FIG. 7 through a transmitting multiplexer 121 and data transceivers 115 onto the SBI 14 at the next SBI T0 time. The BUSY flip-flop 96 responds to the TRANSMIT CA signal by setting at the next SBIT1 time which disables the OR gate 100 and RAISE TR signal. Then the flip-flop 103 is cleared at the next SBIT3 time and terminates the TRANSMIT CA signal. The BUSY signal, a RESET BUSY signal and other signals energize reset logic 106 that establishes an initial condition in a timing shift register 107 that produces TIMING PULSE 0, 1, 2, and 3 during successive cycles, the timing pulses changing at the SBIT2 times. This completes the transmission of the command-address information.

The shift register 107 acts as a state control and enables the CNF circuit 63 to monitor the CNF lines 41 at the appropriate time or times. When a positive confirmation is received, the shift register 95 is loaded with an ANY READ output from a sequence decoder 108 that responds to a sequencer (SEQ) 109 by generating the ANY READ signal when the command-address information defines any of the reading operations. Thus, at the next SBIT1 time, the shift register 95 will assert an EXPECT READ signal that energizes the OR gate 93 thereby to maintain the BUFFER FULL signal at an asserted level.

When the responder nexus has retrieved the requested data items and gains control of the SBI 14 and transmits the data item and other information, a comparator 110 and nexus ID circuit 111, that form part of the ID circuit 57, coact to generate a MY ID signal when the incoming ID signals on the SBI 14 correspond to the signals from the nexus ID circuit 111. If the TAG signals indicate that the information is read data, no parity errors are detected and the commander nexus has not timed out waiting for a response, an AND gate 112 generates an ANY READ DATA signal. At the next SBIT1 time, the flip-flop 94 generates the READ DATA FF signal that energizes the OR gate 93 and conditions a flip-flop 113 to be set at the next SBIT2 time thereby to enable a decoding circuit 114 to produce a WANTED DATA signal. The WANTED DATA signal enables the condition circuit 91 to disable the STALL signal at the next SBIT0 time.

At the time that the READ DATA FF signal shifts to an asserted state, it also enables the control logic 90 in FIG. 7 to control the transfer of data from a data transceiver 115 and read data register 116 to be diverted to the MD bus 75 through a driver circuit 117. It also will be apparent that the incoming data could be routed through the data transceiver 115, an SBI silo circuit 122, an ID bus multiplexer 123 and a driver circuit 124 onto the ID bus 83 for diagnostic purposes.

FIG. 9 depicts the timing for an extended reading operation. As shown, the responder nexus initiates a bus transaction during the cycle designated "MEMORY TR" and transfers a read data item during the next bus cycle. The responder nexus also transmits the HOLD signal during the same bus cycle that it transmits the first read data item so it can transfer the second read data item on the subsequent bus cycle.

FIG. 10 depicts the timing sequence for the signals that are generated during a writing operation. For this transfer the microsequencer 44 issues a writing command and provides the address and data items over the PA bus 72 and MD bus 75 respectively. The flip-flop 92 then asserts the RAISE TR FF signal and causes the OR gate 93 to assert the BUFFER FULL signal. At the next SBIT1 time, the BUSY flip-flop 96 sets and the reset logic 106 then enables the state counter 107. Four timing pulses are generated for a writing operation involving only one longword. These pulses define the command-address time, write data time and two acknowledgement times respectively. When the second acknowledgement signal is received over the CNF lines 44, the RAISE TR FF, BUFFER FULL and BUSY signals are terminated. It will also be apparent from FIG. 10 that the data item is simultaneously written into the cache memory at the beginning of the operation.

(4) Memory Units 11

With this understanding of the basic construction and operation of an SBI control circuit, such as the SBI control circuit 71 in FIG. 6, operating as a commander nexus in both the transmitting and receiving states, we now will describe the operation of a memory controller as a responder nexus.

Figure 11:
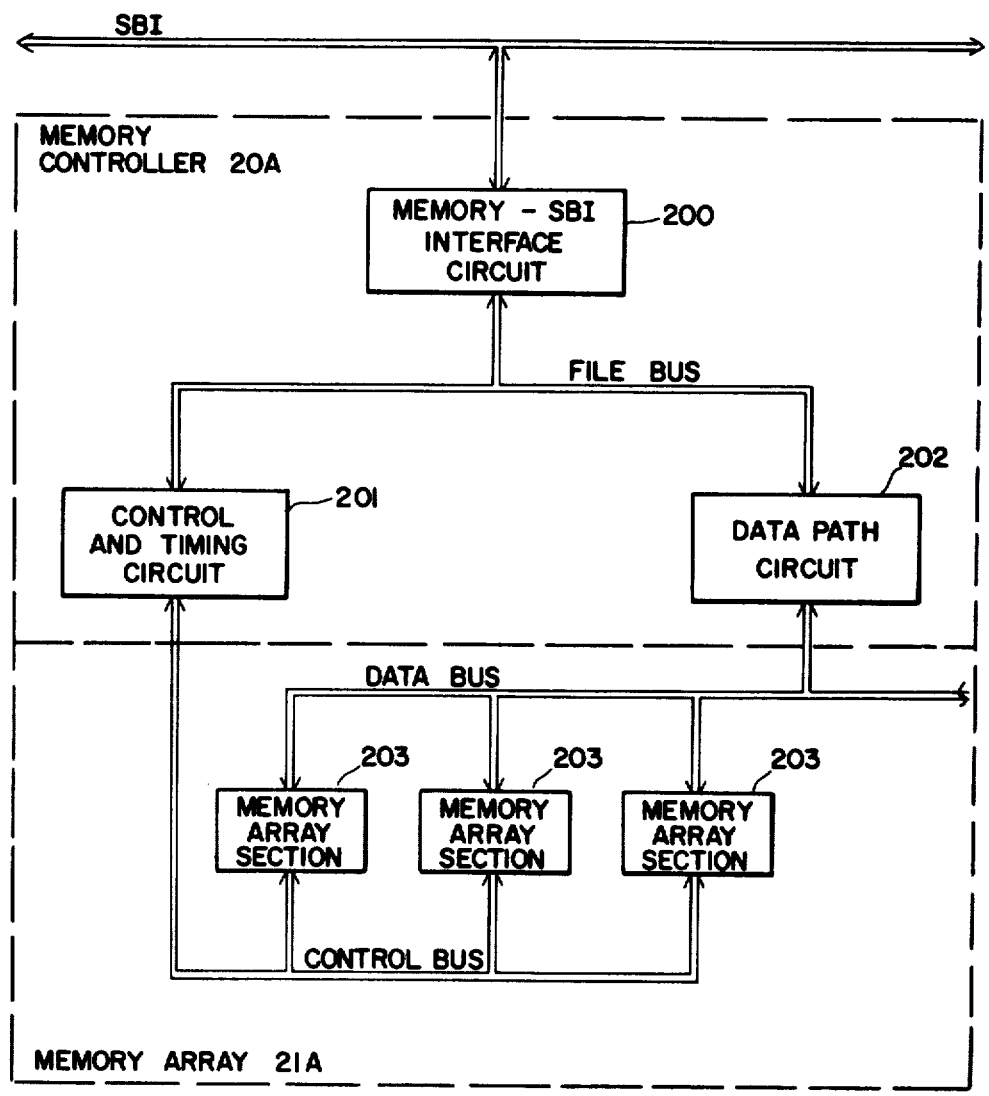
FIG. 11 is a block diagram of a memory controller and memory array as shown in FIG. 1.

Memory controller 20A and one array 21A are shown in FIG. 11 as a typical memory unit. The memory controller 20A includes a memory-SBI interface circuit 200 that contains many of the circuits shown in the nexus 32B in FIG. 3. This interface 200 connects through a FILE bus to a control and timing circuit 201 and a data path circuit 202. A CONTROL bus from the control and timing circuit 201 interconnects various memory array sections 203 while a DATA bus interconnects the memory array sections 203 and the data path circuit 202.

Figure 12:
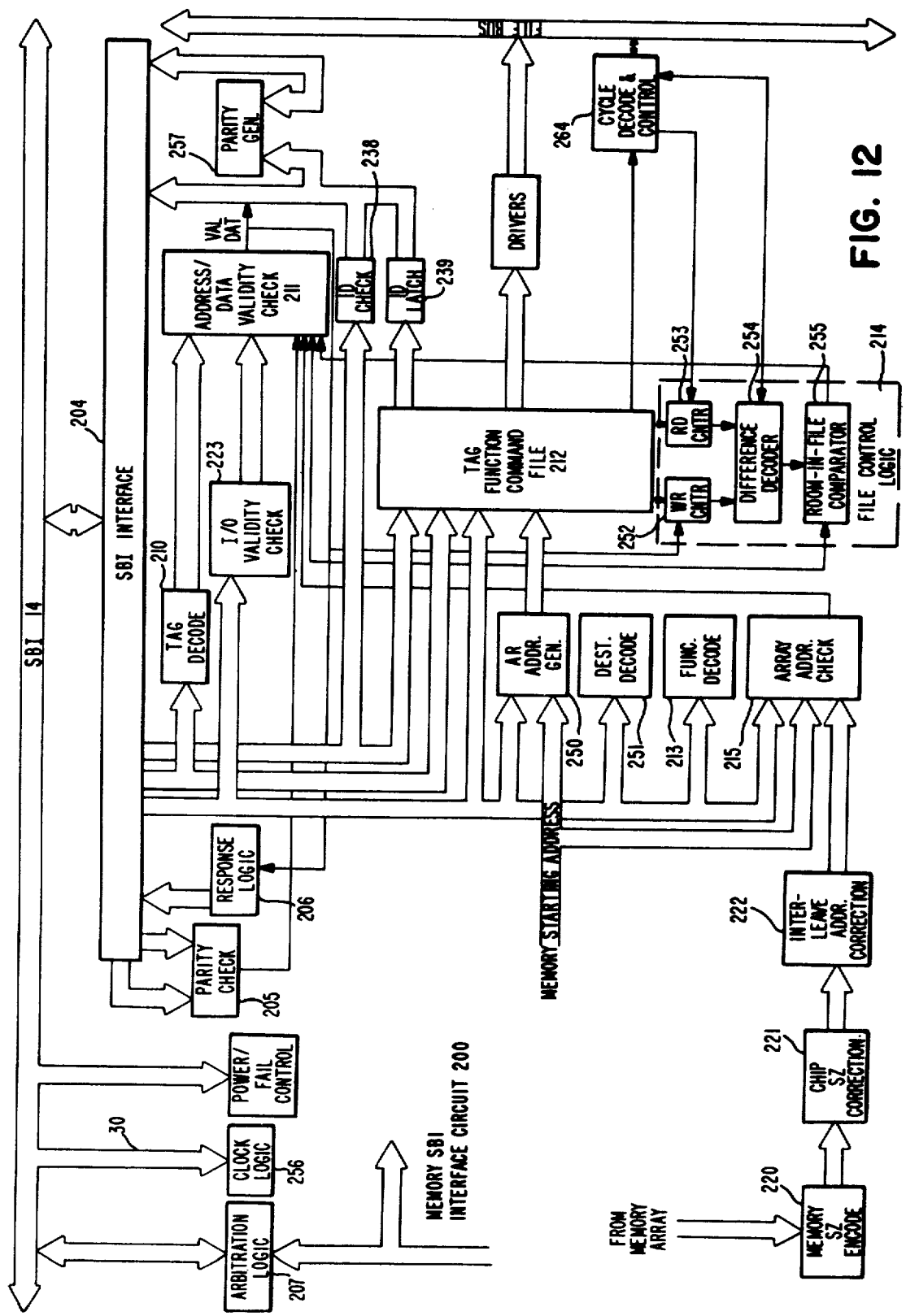
FIG. 12 is a block diagram of a portion of the memory controller shown in FIG. 11.

Referring to FIG. 12, the SBI interface circuit 200 comprises a number of drivers and receivers in an SBI interface 204 that connect to the SBI 14 directly. Other portions of the memory SBI interface 200 include circuits for responding to these signals and for generating appropriate signals onto the SBI 14.

Figure 13:
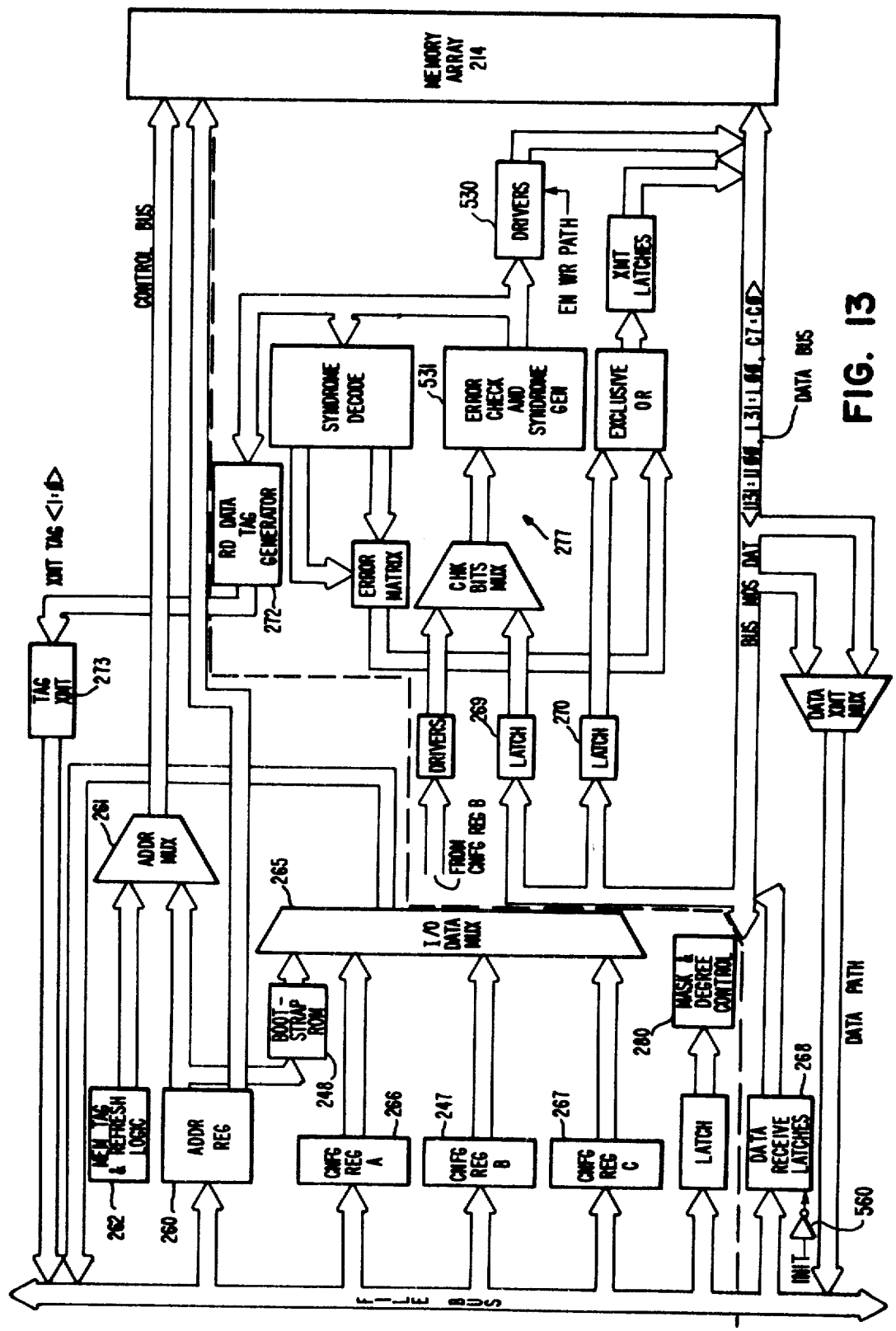
FIG. 13 is a block diagram of another portion of the controller shown in FIG. 11.
Figure 14:
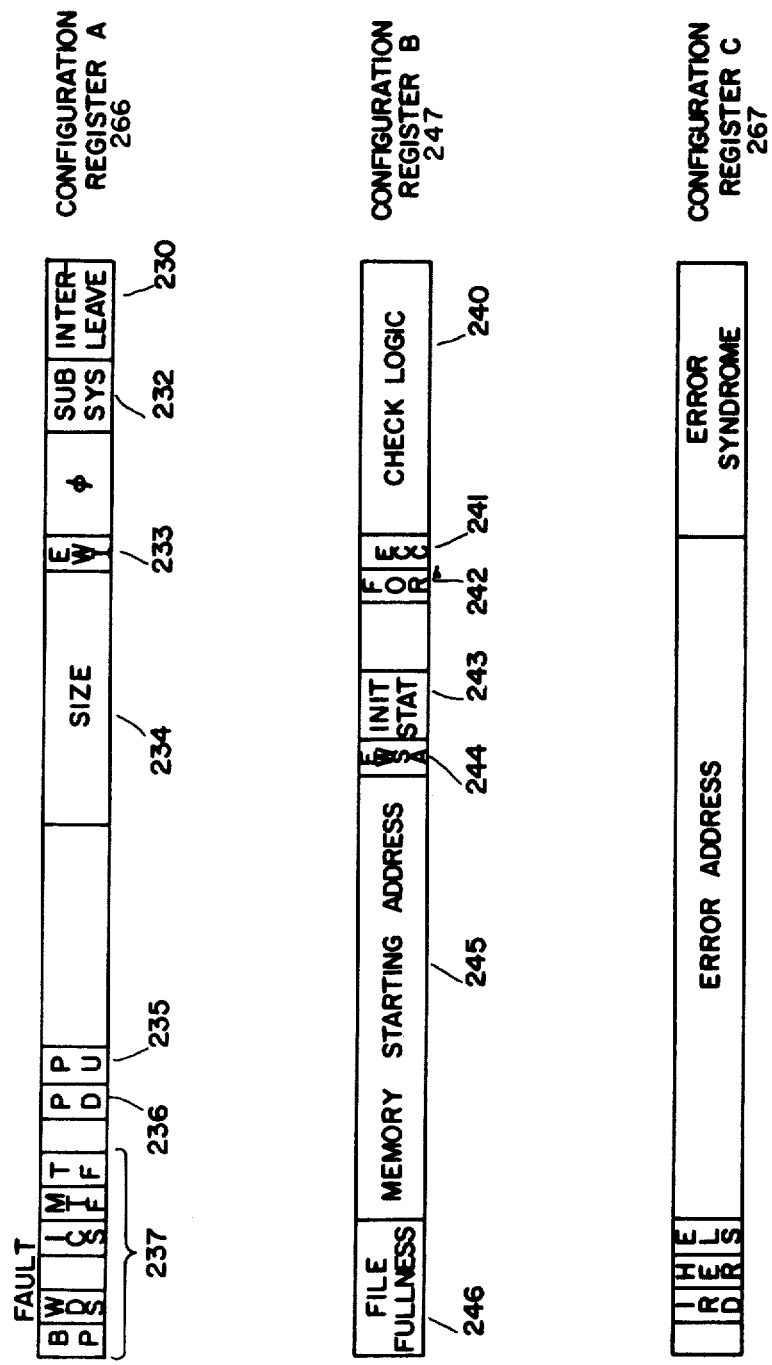
FIG. 14 depicts registers that are utilized in the memory controller shown in FIG. 11.

Before describing the operation of this memory controller and array, it will be helpful to describe the function of specific circuits that are shown in FIGS. 12 through 14. Still referring to FIG. 12, a parity check circuit 205, included in the parity circuit 61 assuming the nexus 32B corresponds to this memory controller, receives the parity and all other signals from the SBI interface 204 and monitors for any parity errors. Response logic circuit 206 corresponds to the CNF circuit 63B and the FAULT circuit 62B; it transmits a response in the form of a confirmation or error, as previously described, no more than two bus cycles after the memory receives a command-address or write data. It is described with respect to FIG. 20.

The arbitration logic circuit 207 corresponds to the arbitration circuit 33B and it, like the circuitry shown in connection with the central processor unit, determines when the memory controller 20A gains control of the SBI 14. This circuit connects directly to the SBI 14. It is described with respect to FIGS. 17A through 17C.

Tag decode circuit 210 corresponds to the tag circuit 60B in FIG. 3. It decodes the tag field of received information on the tag lines 35 thereby to determine the nature of the signals on the information lines 40. The decoded tag is routed to an address-data validity checking circuit 211 and the tag field is routed to a command file 212.

A function decode circuit 213 decodes the function signals when command-address information is received from the SBI 14. This circuit determines the validity of the function signals by comparing them against the allowed function signals. The functions bits also are transmitted to the address/data validity check circuit 211 and the command file 212.

The address-data validity checking circuit 211 generates a VAL DAT signal when the parity check circuit 205 indicates that no parity errors exist, when the function decode circuit 213 indicates that the function bits are valid and when the destination address, function and other information all indicate that the operation can be performed in the memory. Circuitry in file control logic 214, discussed in detail with respect to FIG. 22 and associated with the command file 212, enables the information on the SBI interface 204 to be transferred into the command file 212 and a write counter 252 to be incremented in response to the VAL DAT signal.

An array address checking circuit 215 determines whether the received address on the information lines 40 falls within the range of memory locations that is associated with the particular memory controller. The circuit 215 also receives signals from a memory size encoding network 220, a chip-size correction circuit 221 and an interleaving address correction circuit 222. Circuits for checking incoming addresses against valid ranges of memory locations are well known in the art.

An I/O address validity checking circuit 223 determines if the address and selected function are valid for any control registers that are included in the memory controller. In one specific embodiment a memory controller includes three configuration registers, that are shown schematically in FIG. 14, and a read-only memory.

Configuration register A in FIG. 14 includes an interleaving information field 230, a subsystem field 232 that indicates the size and type of memory and an enable write interleave field 233 that enables the interleave field to be written. A size field 234 indicates the size of memory storage connected to the memory controller. A power up flag 235 and a power down flag 236 indicate whether the memory is undergoing either one of the corresponding sequences. Fault condition flags 237 including a transmit fault (TF), multiple transmitter fault (MTF), interlock command sequence fault (ICS), write data sequence fault (WDS) and bus parity (BP) fault also are included. The TF signal is generated if the memory was operating as a transmitting nexus when a fault occurred. The MTF signal indicates an ID check circuit 238 (FIG. 12) detects ID signals on the lines 37 (FIG. 3) that differ from the ID signals being transmitted by an ID latch 239 at the time that the memory controller acts as a transmitting nexus. The ICS signal is asserted when an interlocked masked writing command is received, but the INTERLOCK signal on the control line 51 is not asserted. Interlocked exchanges require that the commander nexus issue a interlocked masked reading command before the interlocked masked writing command is sent. The first command causes an interlock flip-flop in the commander nexus to be set thereby to assert the INTERLOCK signal. The WDS signal is asserted whenever any of the writing commands is sent and not immediately followed by write data during the subsequent bus cycle. The BP signal is asserted whenever a parity error is detected.

Still referring to FIG. 14, configuration register B contains information for testing the error checking logic and memory status. It includes a force check bits field 240 used for forcing error corrections and a FOR field 242 to force an error at a predetermined address. An ECC field 241 is used to disable the ECC circuit. An INIT STAT field 243 indicates whether the memory data is valid, the memory is in the process of initializing or initialization is complete. Circuitry for controlling this field 243 is described with reference to FIGS. 18 and 19. An EWSA field 244 enables a memory starting address field 245 to be altered. The memory starting address, as the name implies, identifies the first location in the memory. A file fullness field 246 indicates whether the command file 212 in FIG. 11 is full.

Still referring to FIG. 14, configuration register C contains error syndrome, error address and other fields that are used in indicating corrected data if certain types of errors occur.

Referring again to FIG. 12, an address generator 250 generates memory reference addresses in response to the addresses received from the SBI 14 and the starting address signals from configuration register B, identified by reference number 247 in FIG. 13.

A command/address destination decode circuit 251 in FIG. 12 uses the incoming address signals from the SBI 14 to select the appropriate section in the memory. As previously indicated, these address signals may identify a location in an array section 203 (FIG. 11), one of the configuration registers (FIG. 14) or read-only memory 248 in FIG. 13 that is used to initialize the system. The circuit 251 decodes the incoming address signals to select one of these storage locations.

Still referring to FIG. 12, the file control logic 214 monitors the amount of space in the command file 212. It includes a write counter 252 and a read counter 253. A difference decoder 254 monitors both counters 252 and 253. As described later, a room-in-file comparator 255 indicates whether additional information can be loaded into the command file 212 in response to signals from the difference decoder 254 and the function decoder 213 as described later.

The circuitry in FIG. 12 also includes clock logic 256. This logic receives a clocking signals on the lines 30 and produces the necessary timing pulses in synchronism with the clocking signals on the SBI 14. One embodiment of such circuitry is shown in FIG. 16.

When data is transmitted onto the SBI 14, a parity generator 257 responds to the information in the data, ID, TAG and other fields to produce the appropriate parity signals.

In addition, the memory controller contains circuitry for controlling memory cycles during which data is transmitted into or retrieved from a memory array 21A. This circuitry is shown in FIG. 13 and includes an address register 260 that receives the address for the location in an array that is derived from the address information in command-address signals from the lines 40. These signals are directed through an address multiplexer 261 to the memory array, to the read-only memory 248, or to the configuration registers. The other input to the address multiplexer 261 includes address signals from memory timing and refresh logic 262 that maintains the data in a volatile memory in a valid state. Refreshing of such memories is well known in the art.

Cycle decode and control logic 264 in FIG. 12 receives information from the command file and generates control signals that are utilized in the circuitry shown in FIG. 13.

Still referring to FIG. 13, a I/O data multiplexer 265 selects data from one of the configuration registers 247, 266 and 267 or the read-only memory 248 for transferring the data onto the FILE bus if the incoming address identifies one of those specific registers. Data receive latches 268 receive a longword of data from the FILE bus and store it temporarily until it is ready to be transferred over the DATA bus into the memory 21A. This data is also loaded into latches 269 and 270 which serve as inputs into an error checking circuit 271 that is not described in any further detail.

A read data tag generator 272 encodes the tag field in accordance with any errors that may exist or not and energizes a tag transmitter 273 when the data is transmitted onto the SBI 14.

During operation of the data processing system, the clock logic 256 monitors the timing signals on the SBI 14. At the SBI T3 time, all information on the SBI 14 is transferred into appropriate latches of all receiving nexuses. Initially, all signals on the SBI 14 are tested for parity. If a parity error is detected, various flags are set and cleared and a parity fault is indicated. If write data is being received, it is placed in the command file along with an indicator that will abort the write cycle and the write counter 252 is advanced. If command-address information is received, it is placed in the command file 212, but the write counter 252 is not advanced.

Assume that command-address information is received without error, the tag decode circuit 210 decodes the function signals. If the address signals specify a location in a memory array, the address is transferred into the command file 212. The memory array can be accessed by any of the valid functions; if an invalid function is detected, the CNF signals will be set to an error state.

B. Description of Specific Circuits (1) System Timing Circuits

Figure 15A:
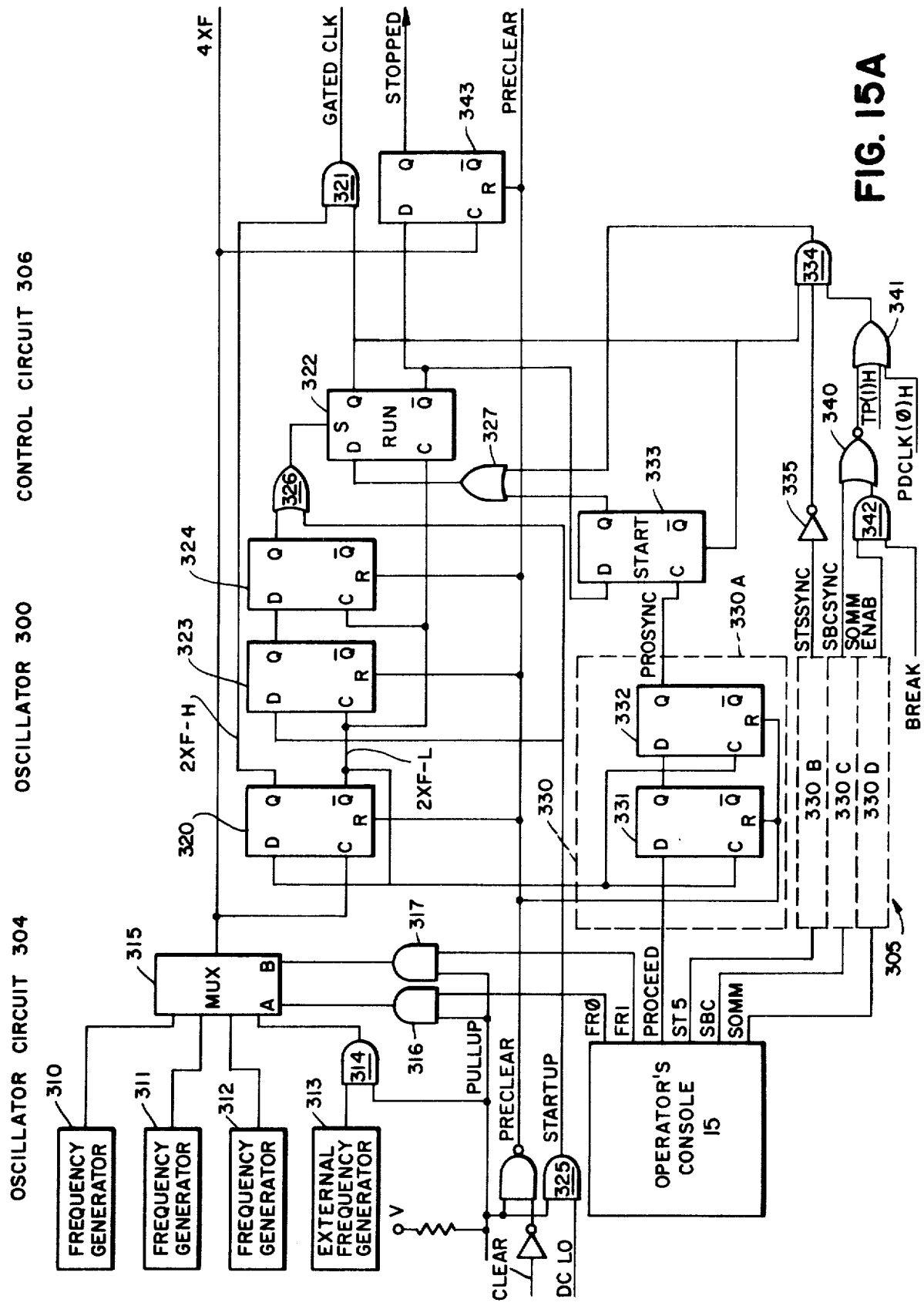

FIG. 4A through 4K discloses the various wave forms that appear on the SBI 14 and the internal timing signals T0CLK through T3CLK that are generated in each nexus in response to those signals. In the foregoing description a clock generator 70 is disposed as an element of the central processing unit in FIG. 6 and produces the clocking signals that are transmitted onto the SBI 14. Such a clock generator 70 could comprise a number of circuits. FIGS. 15A and 15B disclose one such clock generator circuit 70 that provides flexibility and a number of advantages in a data processing system.

As shown in FIGS. 15A and 15B, the clock generator includes an oscillator portion 300 on FIG. 15A that generates GATEDCLK signals as timing reference signals and a sequencer 301 in FIG. 15B that converts the GATEDCLK timing reference signals into phase and clocking signals that are synchronized with the GATEDCLK signals. More specifically, the sequencer 301 produces phase control signals designated as PCLK-H, PCLK-L, PDCLK-H and PDCLK-L signals and clocking signals designated as TP-H and TP-L signals. These signals conform to the wave forms shown in FIG. 4. Moreover, these signals are coupled onto corresponding conductors in the SBI 14 thereby to be coupled to each nexus that connects to the SBI 14. FIG. 16 discloses timing circuitry that is found in each nexus, including the central processor unit shown in FIG. 6. This timing circuitry includes receivers 302 that receives the phase and clocking signals from the SBI 14 and a decoder 303 that converts the received phase and clocking signals into the T0CLK through T3CLK pulses that function as unit timing signals thereby to control the functions in a given nexus.

The oscillator 300 comprises an oscillator circuit 304, a control signal generator 305 that responds to a number of signals including signals from the operator's console 15 and a control circuit 306. The control circuit 306 connects to the oscillator circuit 304 and transmits the GATEDCLK pulses. In the particular embodiment the oscillator circuit 304 includes three discret internal frequency generators 310, 311 and 312 and a connection for an external frequency generator 313. The use of multiple frequency generators simplifies system testing. In one specific embodiment one of the oscillator internal frequency generators produces a 40 MHz signal as a normal signal while the other two internal frequency generators 311 and 312 produce timing signals at a slightly faster and a slightly slower rate. An external frequency generator 313 is coupled through an AND gate 314 that is enable whenever DC power is applied to the system thereby to generate a PULLUP signal. The outputs of the frequency generators 310 through 313 are individually coupled to inputs of a multiplexer circuit 315. This multiplexer circuit selects one of the four inputs in response to FR0 and FR1 signals from the operator's console 15. The FR0 and FR1 signals are applied to AND gates 316 and 317 and are coupled to selection inputs of the multiplexer 315 whenever the pullup signal is asserted. Once one input is selected, the multiplexer 315 couples the signal from the selected frequency generator to the control circuit 306 as a 4XF signal.

In addition, the 4XF signal is applied to a flip-flop 320 that is connected to operate as a divider circuit thereby to produce a 2XF-H and 2XF-L signals. If the 40 MHz frequency generator 310 is selected, then the 4XF signal has a frequency of 40 MHz and the 2XF signal has a frequency of 20 MHz. The 2XF signals are coupled through an AND gate 321 as the GATEDCLK signals whenever that AND gate 321 is enabled by a RUN flip-flop 322. The control signal generator means 305 controls the state of the RUN flip-flop 322.

More specifically, the 2XF-L signals clock a shift register comprising flip-flops 323 and 324. When the data processing system is initially energized, a DCLO signal is asserted. Normally the PULLUP signal will reach an asserted level before the DCLO signal terminates. During this interval an AND gate 325 asserts a STARTUP signal that terminates when the DCLO signal shifts to a non-asserted state, this occurring when the DC power supplies reach normal operating levels. The resulting STARTUP pulse is applied to the D input of the flip-flop 323 and energizes an OR gate 326 thereby to directly set the RUN flip-flop 322 and enable the AND gate 321. One clock pulse later, the flip-flop 324 sets and further energizes the OR gate 326. Once the STARTUP signal terminates two additional pulses of the 2XF-L timing signal must be generated before the OR gate 326 is de-energized and thereby removes the overriding setting signal from the RUN flip-flop 322. This circuit guarantees that the clock will be running during the power up sequence. Once that sequence has been completed, and assuming no other actions occur at the operator's console, an OR gate 327 will be de-energized and the next 2XF-L clock pulse will clear the RUN flip-flop and disable the gate 321. Thereafter the remaining circuitry in the control signal generator 305 controls the RUN flip-flop 322. The flip-flops 323 and 324 assure that the STARTUP signal shifts to a non-asserted level sychronously.

Now referring to the control signal generator 305, the FR0 and FR1 signals control the selection of the internal or external frequency generator. These signals may be produced by a physical switch on the operator's console or the operation of various microcoded controllers that perform the operator's console function.

During normal operation the operator's console 15 asserts a PROCEED signal that is passed through a buffer network 330. This network for the PROCEED circuit comprises flip-flops 331 and 332 that serve as a two-stage shift synchronizer register that is clocked at the 2XF frequency, and is identified by reference numeral 330A. Corresponding shift synchronizer register circuitry is found in the other buffer circuits that are identified by reference numerals 330B through 330D.

When the flip-flop sets, a PROSYNC signal clocks and sets a START flip-flop 333 if the run flip-flop 322 is cleared. Setting the START flip-flop 333 then energizes the OR gate 327 and the next positive-going transition of the 2XF-L signal clocks the RUN flip-flop 322 to a set state and enables the continued transmission of GATEDCLK signals. Setting the RUN flip-flop also clears the START flip-flop 333. However, setting the RUN flip-flop 322 also enables an AND gate 334. If the other inputs are enabled, as they normally are, the AND gate 334 energizes the OR gate 327 so that the RUN flip-flop 322 is maintained in the run state, and the AND gate 321 continues to transmit th GATEDCLK signals as the timing reference signals.

If the operator wishes to step through a sequence of operations in one state intervals, the operator's console 15 produce an STS signal. The buffer 330B then generates an STSSYNC signal and inverter 335 disables the AND gate 334. Each time the RUN flip-flop is set, an AND gate 334 is enabled, the AND gate 334 is designed so that only one GATEDCLK pulse is generated each time the operator causes the PROCEED signal to be asserted. If the STS signal is asserted while the RUN flip-flop is set and free running GATEDCLK pulses are being produced, the buffer circuit 330B produces a two state delay in order to synchronize the termination of the GATEDCLK pulses.

Whereas the STS signal from the operator's console 15 defines a single time state, an SBC signal, when produced, defines a single bus cycle as depicted in FIG. 4. When the SBC signal is aserted and the GATEDCLK pulses are being generated in a free running mode, the buffer 330C produces an SBCSYNC signal after a pair of 2XF-L clock pulses. This causes a NOR circuit 340 to produce a disabling input to an OR gate 341. The OR gate also receives the TP clocking signal and one phase control signal from the SBI 14. Thus, the NOR gate 341 disables the AND gate 334 at the beginning of the next T0 time immediately before the next successive bus cycle. Thereafter a series of GATEDCLK pulses will produce one sequence of the T0 through T3 pulses in succession each time the operator causes the PROCEED signal to be asserted.

In a data processing system in which microprogram control techniques are utilized, the microprogram controller will include a microprogram counter and may also include a microbreak register which includes a particular microprogram count. Whenever the microprogram counter and the microbreak register contain the same value, a comparison circuit, not shown, asserts a BREAK signal. A SOMM signal from the operator's console causes the clock to be stopped whenever such a BREAK signal is generated. More specifically, a buffer circuit 330D produces an SOMMENAB signal that enables an AND gate 342. While the BREAK signal is not asserted, the AND gate 342 causes the NOR gate 340 to generate a signal that energizes the OR gate 341 and produces one enabling input to the AND gate 334. However, when the SOMMENAB signal and the BREAK signal are asserted simultaneously, the AND gate 342 energizes the NOR gate 340 and thereby establishes an internal condition that allows the OR gate 341 to shift to a non-asserted state at the beginning of the next bus cycle thereby to disable the RUN flip-flop and terminate the GATEDCLK pulses.

Whenever the run flip-flop 322 is cleared, another flip-flop 343 is clocked by the next 4XF clock pulse to generate a STOPPED signal. This signal normally is routed to the operator's console thereby to provide information to the operator.

Thus, the oscillator 300 shown in FIG. 15A produces GATEDCLK pulses as a reference timing signal at a frequency which is half the value of the base frequency produced at the output of the multiplexer 315. The GATEDCLK pulses are then applied to the sequencer 301 in FIG. 15B. The sequencer 301 comprises three sequence latches 350, 351 and 352. A number of gates provide feedback circuitry from the outputs of these sequence latches to their inputs thereby to enable the sequence latches to produce clocking and phase control signals that are coupled to driving latches 353 through 358. The sequence latch 350 is clocked by the complement of the GATEDCLK pulse supplied by an inverter 360. The signal at the D input is generated by an OR gate 361 if either an AND gate 362 or an AND gate 363 is energized. The AND gate 362 is energized if a phase delay clock latch 351 is cleared and the clocking sequence latch 352 is cleared. The AND gate 363 is energized if the sequence latch 350 is set and the TP latch 352 is set. The PDCLK sequence latch 351 is set if an OR gate 364 is energized. Whenever the AND gate 363 energizes the OR gate 361 it also energizes the OR gate 364. The OR gate 364 also is energized by an AND gate 365 whenever the sequence latch 351 is set and the sequence latch 352 is clear. The latch 352 is set whenever an exclusive OR gate 366 is energized. One input to the exclusive OR circuit 366 is asserted whenever the sequence latch 350 is set and the other input is energized whenever the input to the sequence latch 351 is set. An analysis of this feedback circuit comprising the gates 361 through 366 will show that the wave forms in FIGS. 4A through 4F are produced by the sequence latches 350, 351 and 352. The outputs of these latches are then coupled to the driving latches 353 through 358 to specifically produce the six signals on the SBI 14. The driving latches are updated by the 4XF signal from the multiplexer 315. Referring specifically to the drive latches 357 and 358, it will now be apparent that the TP-H and TP-L signals occur at a 10 MHz rate whereas the PCLK-H and PCLK-L pulses from the drivers 353 and 354 and the PDCLK-H and PDCLK-L signals from the driver latches 355 and 356 have a characteristic frequency of about 5 MHz. As a result each of the T0CLK through T3CLK pulses are produced at a 5 MHz rate and have a 25% duty cycle. Thus, with a 40 MHz frequency generator selected, the data processing system that has been disclosed is capable of producing bus cycles at a 5 MHz rate.

Each nexus, including the central processing unit includes a timing means that establishes the internal timing for that unit in response to the T0CLK through T3CLK pulses shown in FIGS. 4G through 4J. The receivers 302 in FIG. 16 include differential receiver circuits 370, 371 and 372 for the TP, PDCLK and PCLK signals and their complementary signals, respectively. In this particular embodiment the decoder 303 includes NOR gates 373 through 376. Thus, the NOR gate 373 asserts the T0CLK pulse while the TP-H signal and the PCCLK-H signals both are asserted. The T1 CLK pulse is produced when the TP-H pulse is not asserted and the PDCLK-H signal is asserted.

The foregoing operating speeds or frequencies are achieved in part because the decoding function for producing the T0CLK through T3CLk pulses shown in FIG. 4E through 4G are performed within each nexus. They are all clocked in response to only one critical timing signal, namely the TP signal and are controlled by the PDCLK and PCLK signals that operate as phase control signals. Thus, variations in propagation delays for the two control signals can occur. However, the exact shift of the timing signals is limited only to the single TP clocking signal and this allows stricter controls to be placed on the T0CLK through T3CLK timing pulses. It minimizes the effect of propagation delays over the SBI 14. These are relatively uncontrolled whereas various gating propagation delays are controllable and/or definable. Thus, the timing circuitry shown in FIG. 15A, 15B and FIG. 16 allows greater operating speeds to be achieved.

(2) Arbitration Circuits

Figure 8:
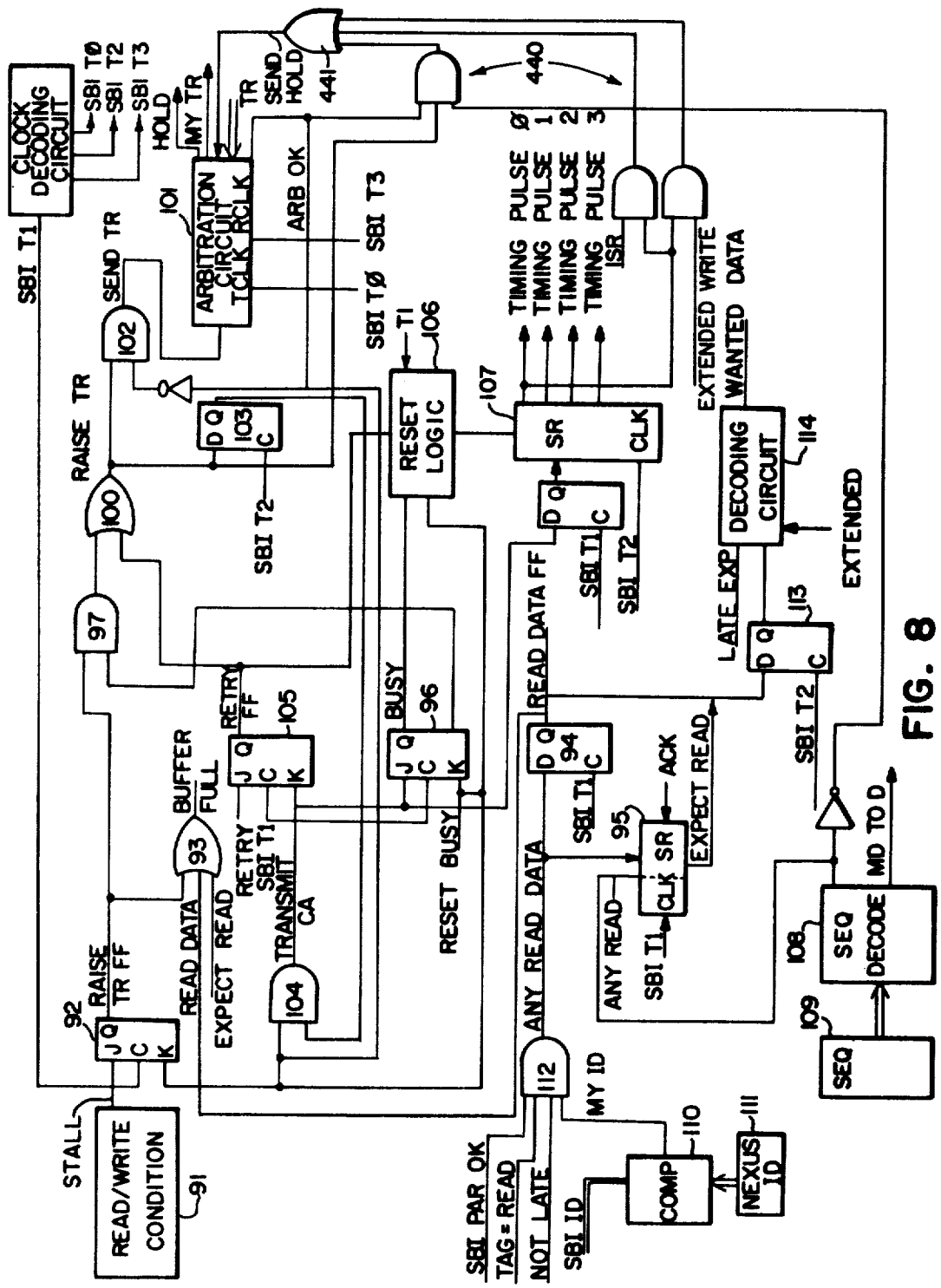
FIG. 8 is a detailed block diagram of relevant portions of control logic shown in FIG. 7.

As previously indicated with respect to FIGS. 3 and 8, each nexus contains an arbitration circuit 101. That circuit responds to timing signals, other arbitration signals in the system on the arbitration conductors 31 shown in FIG. 3 and the control signals from the nexus itself. Each arbitration circuit operates independently in the system and allows each nexus to determine whether it is to obtain control of the SBI 14 for affecting a transfer. The clock decoding circuit shown in FIG. 8 produces a number of timing signals identified as SBI T0 through SBI T3 timing signals and these correspond to the T0CLK through T3CLK signals shown in FIGS. 4g through 4j.

FIGS. 17A and 17B constitute a detailed circuit diagram of an arbitration circuit that is particularly useful in the previously described data processing system. It includes a priority assignment circuit 400 that establishes a priority level that is unique to each nexus. As there is an arbitration circuit such as shown in FIG. 17A in each nexus, then each nexus has its own priority assignment circuit 400. In this particular circuit inverting amplifiers 401 through 404 are resistively coupled to a positive power supply and the inputs may be selectively grounded. This establishes a selector code. FIG. 17C sets forth codes that are used with this particular arbitration circuits. In response to the selective grounding of the inputs, the inverting amplifiers 401 through 404 will generate A H through D H signals respectively. Another set of inverters 405 through 408 connect to the outputs of the inverting amplifiers 401 through 404 and produce the complements of those signals, namely A-L through D-L signals, respectively. For purposes of discussion it is assumed that the arbitration circuit is in a nexus that is to be assigned a priority level of "7". In accordance with the chart in FIG. 17C, the inputs to the inverting amplifiers 402 and 403 are grounded. As a result the A H and D H signals are at low levels while the B H and C H are at high levels.

Priority receivers 410 connect to the arbitration conductors 31 shown in FIG. 3 that are designated in FIGS. 17A and 17B by mnemonics BUS TR15 L through BUS TR0 L. The receivers comprise inverting amplifiers to produce positive assertion outputs in response to ground assertion signals on the SBI. Inverting Amplifiers 410-0, 410-5, 410-7 and 410-15 are specifically designated for later discussion.

As will become apparent, a comparison circuitry 411 responds only to signals from nexuses having a higher priority than the nexus that contains the unit. In the specific embodiment, the comparison circuit 411 will only respond to the BUS TR0 through BUS TR6 signals. The receivers comprise inverting amplifiers to produce high level outputs when ground assertion signals appear on the bus. The comparison circuit 411 contains four sections, namely, sections 412A through 412D. The output of each section connects to an AND gate 413 that generates the ARB OK signal also disclosed in FIG. 8. Thus, the ARB OK signal is asserted only when the outputs from all four sections of the comparison/latching circuit 411 are at a high level.

Section 412A (FIG. 17B) connects to bus arbitration conductors of the four lowest priorities. Specifically the output of inverting receiver 410-15 is OR'ed with the output of an AND gate 414. If the output from either the inverting amplifier 410-15 or the AND gate 414 shifts to a low level, the output signal of a NAND gate 415 shifts to a high level and constitutes one enabling signal to the AND gate 413. There are four inputs to the AND gate 414 from the priority assignment circuit 400. With a priority of "7", the A H signal is at a low level so the AND gate 414 forces the input to the NAND gate 415 to a low level and provides an enabling output for the AND gate 413 if all the other outputs of the gates connected to the output of AND gate 415 are high. Similarly the outputs of all the AND gates in sections 412A and 412B are at high levels, so there are two enabling inputs to the AND gate 413. Likewise, a NAND gate 416 and a NOT OR gate 417 control an input to a NAND gate 418 in section 412C that is shown in FIG. 17A. The gates 416 and 417 also hold the input to the NAND gate 418 at a low level. Thus, NAND gates, like the NAND gates 415 and 418, in the circuitry associated with the priority arbitration lines in the same and lower priorities as a given nexus are clamped or held at an enabling level. As will now become apparent, the remaining circuitry is responsive to the appearance of signals on arbitration conductors of a higher priority level. Therefore, the receivers 410 operate essentially to transfer only request signals having a higher priority level than a nexus means.

FIG. 17A also disloses a request circuit 420 that generates a plurality request signal onto an arbitration conductor of corresponding priority. In this specific case, the request circuit 421 transmits a MY TR signal that would be transferred onto the BUS TR 7 conductor, thereby to be transmitted at a priority corresponding to the priority assigned by circuit 400.

Assuming that the priority "7" does not require access to the SBI 14, the SEND TR signal from the AND 102 in FIG. 8 would not be asserted. Therefore successive SBI T0 CLK pulses signals to a clocked flip-flop 421 would maintain the flip-flop in a reset state thereby to enable an AND gate 422 in latching circuit 423. When the SBI T2 CLK timing pulse is asserted, an inverter 424 enables the AND gate 422 so clearing the flip-flop 421 energizes the AND gate 422 and causes a NOR gate 425 to produce a low output signal that disables the ARB OK AND gate 413. Moreover, a feedback circuit comprising an inverter 426 conditions another AND gate 427 so that the SBI T2 CLK signal does not alter the output from the NOR gate 425. Thus, it is not possible for the ARB OK signal to be transmitted within the nexus so long as the SEND TR signal is not asserted.

When the priority "7" nexus does require access to the bus, the AND gate 102 asserts the SEND TR signal and the flip-flop 421 sets on the leading edge of the next SBI T0 CLK pulse. The MY TR signal is then transmitted onto the BUS TR 7 conductor for transmission to all other nexuses in the data processing system. At the same time any other nexus that requires access to the SBI 14 transmits its MY TR signal onto its corresponding TR conductor.

Assume that a priority "5" nexus does assert a signal on the BUS TR 5 conductor simultaneously with the MY TR signal generated by the flip-flop 421. The output from the receiver 410-5 will reflect the condition of the signal on the BUS TR 5 conductor because control gates 430, 431 and 432 do not produce an overriding low output at the output of the gate 431. Normally the input to the NAND gate 433 will be at a low level. When the BUS TR 5 signal is asserted and the SBI T2 clock is asserted, the output from the NAND gate 433 shifts to a low level and turns off the ARB OK signal. A latch 434, constructed like the latch shown in latch 423, conditions the output from the stage 412C so that the ARB OK signal is maintained at a non-asserted level. Thus, it is not possible for priority "7" nexus to obtain access to the bus. However, it does continue TR assert its SEND to signal.

When no higher priority request exists, the ARB OK signal is asserted because the AND gate 422 is disabled when the flip-flop 421 sets. The assertion of the ARB OK signal disables the SEND TR signal. However, the flip-flop 421 cannot respond until the next bus cycle. As shown in FIG. 8, the ARB OK signal does not produce any immediate results on any other circuitry. A time delay is necessary to assure that all of the priority arbitration circuits in all the nexuses receive the TR signals from all other nexuses before they determine if they will control the SBI. Once the ARB OK signal is asserted, then the nexus is enabled to transmit information during the next T0 CLK pulse. This information may comprise either command and address information or read data.

If the requested transfer is a command and address that initiates a writing operation or is the first operation in an interruption summary reading operation or analogous operation, gating circuitry 440 shown in FIG. 8 is enabled to energize an OR gate 441. The OR gate 441, when energized, asserts a SEND HOLD signal that also is coupled to the arbitration circuit 101. Referring again the FIG. 17A, and assuming for example that a command and address has been sent that denotes a writing operation, the same SBI T0 CLK pulse clears the flip-flop 421. However, a flip-flop 442 sets because the SEND HOLD signal is asserted. This allows the flip-flop 442 to place a ground assertion signal on the BS TR 0, or HOLD, conductor in the SBI. At the same time, the inverting receiver 410-0 energizes an AND gate 443 and disables the NAND gate 413. Although this disables the ARB OK signal, the control circuitry in the nexus then affects the transfer of data or other information over the bus.

(3) Memory Initialization Circuits

Figure 18:
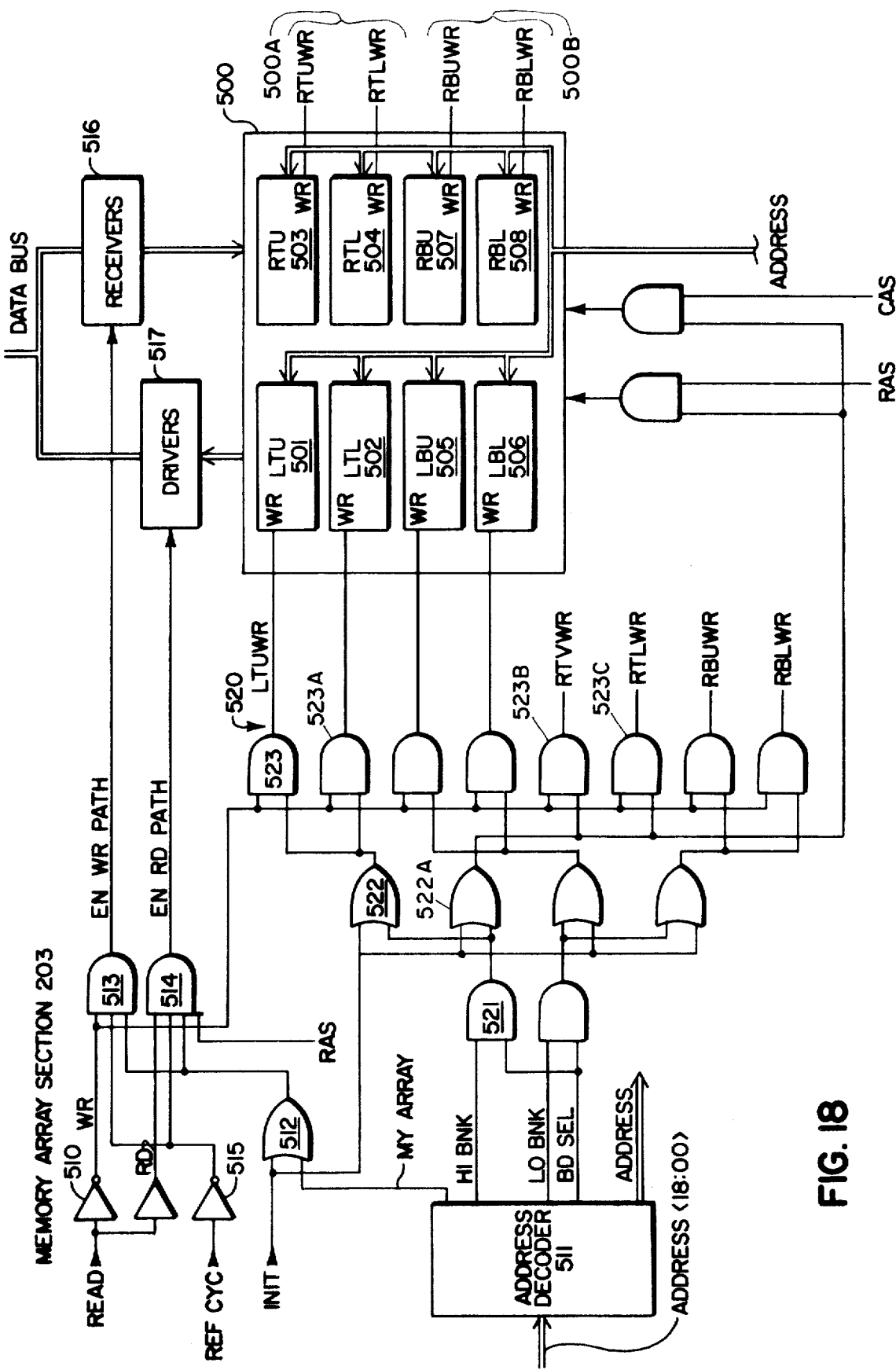
FIG. 18 is a logic diagram of initialization circuitry associated with a memory array section shown in FIG. 11.

As shown in FIG. 11, a memory element that connects to the SBI includes a memory controller and a memory array. Moreover, each memory array includes a plurality of memory array sections 203. A typical memory array section is shown in FIG. 18. It includes a number of memory modules, in this particular application they are identified by reference numerals 501 through 508. These modules can be individually selected and are designated by their position within the array. Arbitrarily the array is divided into a matrix having left and right halves and also having top and bottom halves. Each of the four sections in this matrix comprises two modules including an upper module and a lower module. Thus, the memory module 501 is the left top upper (LTU) module whereas module 508 is the right bottom lower (RBL) module.

The eight modules 501 through 508 are divided into an upper bank 500A and a lower bank 500B. Each of the modules in a bank stores selected bits of each information word directed to the respective module, as described hereinafter.

Each module comprises a number of addressable storage locations. As previously indicated, a reading operation from a memory element is initiated when a commander nexus issues command and address information that identifies the reading operation and a location from which the data is to be obtained. Likewise, a writing operation can also be performed.

When a writing operation is to be performed, a READ signal is not asserted so an inverter 510 is energized. At the same time an address decoder 511 receives address signals that identify all the locations in the memory element. In this particular embodiment nineteen such address signals are received. The address decoder 511 generates a MY ARRAY signal whenever one of its array sections has been designated. This signal energizes an OR gate 512 and enables an AND gate 513, while an AND gate 514 is disabled. As the operation is to occur in response to a command, an REF CYC signal, that indicates the occurrence of a refreshing cycle, is not asserted so an inverter 515 also enables the AND gates 513 and 514. Thus, during a writing operation the AND gate 513 generates an EN WR PATH signal that opens receivers 516. During a reading operation the AND gate 514 generates an EN RD PATH signal to enable drivers 517.

Still referring to a writing operation, the receivers 576 couple the data on the data bus, also shown in FIG. 13, to data inputs of all the modules 501 through 508. Certain bits of each information word are coupled to data inputs of the modules 501 through 504 constituting upper bank 500A and identical bits are coupled to the data inputs of respective modules 505 through 508 constituting lower bank 500B. At the same time, low order addresses are applied in parallel to all of the addressing means in the memory modules. The low order addresses identify certain locations in each module in the upper bank 500A and the lower bank 500B. A decoding circuit 520 selects and enables all of the modules of either the upper bank or the lower bank to receive and store the information word being written, each of the modules that constitute the selected bank simultaneously storing the respective bits coupled to it.

Still referring to FIG. 18, the address decode responds to the address signals by generating either a HI BNK or LO BNK signal, which identifies the upper bank 500A and lower bank 500B respectively, and a BD SEL signal when the particular memory array section 500 is selected. Assuming that the address identifies the upper bank, that is modules 501 through 504, the HI BNK and BD SEL signals energize an AND gate 521. AND gate 521, in turn, energizes OR gates 522 and 522A thereby to enable the WR write enable signal to energize AND gates 523, 523A, 523B and 523C, that transmit a LTUWR signal, a LTLWR signal, a RTUWR signal and a RTLWR signal respectively. These signals enable the WR write enable inputs of memory modules 501 through 504 and thereby cause the respective bits of the information from the receivers 516 to be stored in the respective modules of the upper bank. Circuitry similar to the decoding circuitry 520 would also be responsive during reading operations for selecting only one such module in a memory array section.

Referring again to FIG. 13, data receive latches 268 receive data from the file bus during a writing operation and transfer that information onto the data bus. In addition, the data signals are conveyed into other circuitry so that drivers 530 can transfer error checking codes from an error check and syndrome generator circuit 531 in response to the EN WR PATH signal from the AND gate 513. Thus, in response to a writing command that identifies a particular location, the data to be written plus the corresponding error checking code is stored in one of the memory modules.

If the memory modules 500 through 508 in FIG. 18 comprise dynamic memory modules, then a refreshing cycle must be performed to maintain the data within the modules. During such a refreshing cycle, circuitry that is not shown but is well-known in the art, generates the REF CYC signal so the inverter 515 in FIG. 18 disables both the AND gates 513 and 514 and prohibits any transfer of data to or from the data bus. However, an oscillator circuit 540 in the control and timing unit shown in FIG. 19 advances a clocking circuit which generates REF ADR signals in sequence. These signals become the address signals in FIG. 18 that identify particular locations and enable a refreshing operation occur within each module simultaneously.

Figure 19:
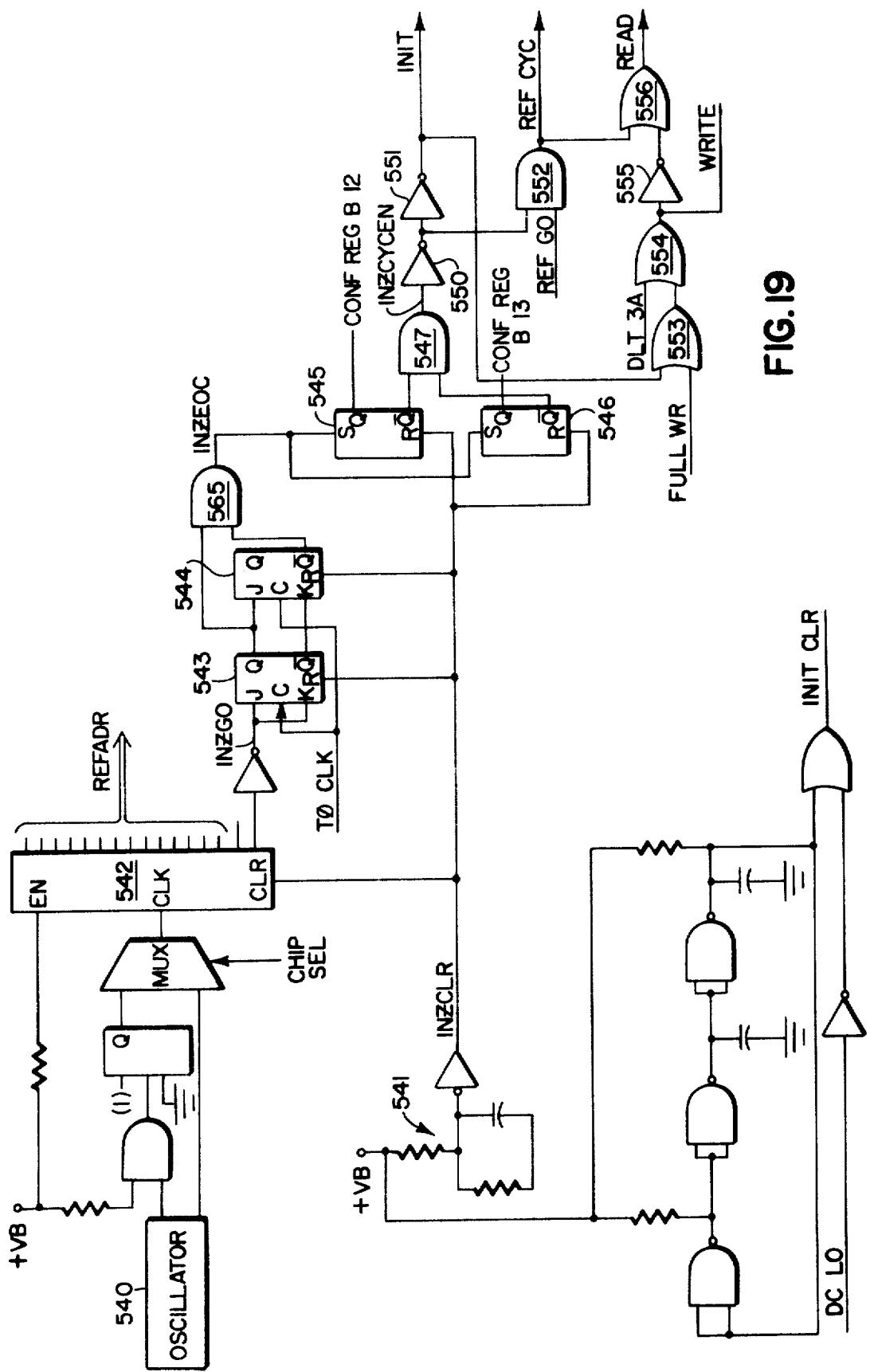
FIG. 19 is a logic diagram of initialization circuitry associated with control and timing circuit in FIG. 11.

The remaining circuitry in FIG. 19 comprises the initialization circuitry that enables a predeterminied initialization operation to occur. This circuitry utilizes the foregoing circuitry thereby to minimize any increase in circuit complexity. Moreover, since the circuitry is implemented in hardware, no additional software is necessary to initialize the memory element. More specifically, when power is applied to the data processing system in what is known as a "cold start", a circuit 541 generates an INZ CLR pulse. This clears a counter 542 and flip-flops 543 through 546. The flip-flops 545 and 546 generate the CONF REG B 12 and 13 signals that constitute the INIT STAT bits 243 in configuration register B 247 shown in FIG. 14. With both the flip-flops 545 and 546 cleared, an AND gate 547 is energized and produces an INZ CYC EN signal. Inverting buffers 550 and 551 thereupon produce an INIT signal that is conveyed to all the memory array sections connected to that particular controller. When the AND gate 547 is energized, the inverter 550 disables the AND gate 552 so the REF CYC signal that was previously described, shifts to a non-asserted state. Moreover, the INIT signal energizes an OR gate 553 that is also energized during a normal writing operation thereby to force an unconditional writing condition by energizing another OR gate 554. As a result, the output signal from an inverter 555 and the REF CYC signal are both in a non-asserted state, so the READ signal also is not asserted. Thus, the circuitry in FIG. 19 generates the INIT signal and starts to generate, in sequence, the REFADR signals.

Referring now to FIG. 13, the assertion of the INIT signal causes an inverter 560 to condition data receive latches 268 to a predetermined state. In one particular embodiment, this causes the data receive latches to generate ONE's on all conductors. These signals are conveyed onto the data bus and through the circuitry that provides signals to the error check and syndrome generator 531 and thence to drivers 530. Thus, the data path shown in FIG. 13 produces data ONE's and corresponding error check codes at the input to receivers 516 in FIG. 18 and, as the gate 513 is energized, at the inputs to all the modules 501 through 508.

Still referring to FIG. 18, the INIT signal energizes the OR gate 512 which is added to the circuitry shown in FIG. 18 to enable the initialization operation to be performed. This signal, as previously described, enables the AND gates 513 and 514. However, as the READ signal is not asserted, only the AND gate 513 is energized to turn on the receivers 516. Another plurality of OR gates, corresponding to OR gate 522, also receives the INIT signal. By energizing all the OR gates, all the AND gates corresponding to AND gate 523 are energized by the WR signal from the inverter 510. As a result all the modules are enabled simultaneously so that data is transferred into all the modules at locations identified by the refresh address simultaneously.

On of the signals conveyed to the circuitry shown in FIG. 19 from the SBI 14 is the T0 CLK pulse. The interval between successive T0 CLK pulses is fast with respect to the time required to sequence through the oscillator 540. When all the refresh addresses have been generated by the counter 542, a second sequence is enabled because the INZ GO signal is still asserted. On the second pass through, however, the INZGO signal shifts to non-asserted state whereupon the next T0 CLK pulse clears the flip-flop 543 so that an AND gate 565 generates an INZ EOC signal for one T0 CLK period time, as the next T0 CLK pulse clears the flip-flop 544. The INZ EOC pulse sets the latches 545 and 546 thereby terminating the INIT signal and the READ signal thereby to complete the initialization.

Therefore, in accordance with the foregoing discussion a dynamic memory is modified to simplify initialization. The circuitry shown in FIGS. 18 and 19 provides a complete initialization period. Moreover, each module is initialized in parallel to a sequence of writing operations that involve only the time necessary to write the data into one module as opposed to all memory locations in sequence.

(4) Response Logic

Circuitry associated with response logic 206 (FIG. 12) in each nexus is shown in FIGS. 20 and 21. In a responder nexus the response logic must be capable of generating response signals. The circuitry in FIG. 12 is associated with a memory element which operates only as a responder nexus. In a commander nexus the response logic additionally must be responsive to the CNF signals on the SBI 14.

In one specific embodiment there are two CNF bits generated by the respose logic 206. Four possible values are generated. If a nexus is not responding, a response logic 206 generates a "0" output. If information from the bus has been properly received, the response 206 generates a "1". If the responding nexus is busy or an error occurs, the response logic 206 generates a "2" or "3" respectively.

Referring now to FIG. 20, the response logic 206 responds to a number of different conditions. A parity decoder 600 generates an ARY ADR PAR OK signal whenever the received address for the memory array has correct parity. The function decoder 213 includes circuitry that asserts a VALID ARY FUNC signal each time a valid function is received. The tag decoder 210 decodes the tag information and generates either a WR DATA TAG OK or a CMD/ADR TAG OK signal depending on the nature of the information in the TAG field. In addition, circuitry described later generates a RM IN FL signal indicating that the command buffer contains sufficient room to receive all the information. The INZ BSY signal is generated by the memory initialization circuitry as previously described. During an interlock operation, an INTLK BLK signal is asserted.

Gating circuitry associated with these elements controls the state of a flip-flop 601 by means of a signal from an OR gate 602 and a flip-flop 603 by means of an OR gate 604. The flip-flops 601 and 603 control the CNF signals.

As previously indicated, a valid response has a value of "1" which is generated when the flip-flop 601 is set and the flip-flop 603 is cleared. Thus, conditions must exist which energize the OR gate 602 and de-energize the OR gate 604. One example of this occurs when an AND gate 605 and AND gate 606 are energized. The AND gate 605 generates an ARY DECODE OK signal when a valid array function is decoded and parity is acceptable. If this condition exists and there is room in the file, (i.e., the RM IN FL signal is asserted) and the memory element is not busy, the AND gate 606 asserts a VALID ARY ADR signal that energizes only the OR gate 602. Analogous circuitry responds to other addresses to generate either a VALID CNFG ADR or VALID ROM ADR signal if a valid configuration register or read only memory address is decoded. Whenever valid parity is received and the tag decoder 210 decodes the presence of data on the line, an AND gate 607 generates an RD GD DATA signal indicating the presence of valid data this also energizes only the OR gate 602.

A number of conditions lead to a busy indication. For example, if a valid array function and address is received but during the initialization operation, the signal from the AND gate 605 and the INZ BSY signal energize an AND gate 610 thereby to energize only the OR gate 604. If there is not sufficient room in the data buffer, AND gates 611, 612 or 613 energize only the OR gate 604 if an array, configuration or read only memory address is properly decoded.

If the parity decoder receives valid array address parity signals but the AND gate 606 is de-energized, an AND gate 614 energizes both the OR gates 602 and 604 thereby to condition the flip-flops 601 and 603 to be set simultaneously. This produces an error condition signal. Similar circuitry will indicate errors if the received address identifies either a location in the read only memory or in the configuration registers.

The time delay between the receipt of the request and the transmission of the response is also controlled by the circuitry shown in FIG. 20. It can be more specifically understood by referring to FIGS. 5 and 20 together and assuming that the SBI sequence "n" is being processed. During bus cycle "2" the parity decoder 600, function decoder 213 and tag decoder 210 all latch the information on the SBI 14 in response to T2 CLK pulse during bus cycle "2". The flip-flops 601 and 603 then respond to the T2 CLK pulse during bus cycle "3". The outputs of the flip-flops 601 and 603 are transmitted onto the SBI 14 from a transceiver circuit 615 that is enabled by an EN XMT DATA signal at the next T0 CLK pulse.

This will be during bus cycle "4" and the delay is thereby achieved. The same control signals control another transceiver 616 that connects to the SBI TAG conductors. As again shown, the T2 CLK pulse latches the information on the TAG conductors to be coupled to the TAG decoder 210. Likewise, XMIT TAG signals can be transmitted onto the SBI 14 in response to the EN XMT DATA signal at the T0 CLK pulse. The EN XMT DATA signal is generated by an OR gate 617 and an AND gate 620. The OR gate 617 is energized by the ARB OK or HOLD ASSRT signal. The ARB OK signal is generated by the AND gate 413 in FIG. 17A and the HOLDASSRT signal is generated by the request circuit 420.

The transceiver 615 also transmits a FAULT signal onto the SBI 14 whenever an OR gate 621 is energized. There are a number of error conditions which energize the OR gate 621. These include writing, parity, write interlock and multiple transmitter faults. A multiple transmitter fault exists when two transmitting nexuses operate simultaneously.

Circuitry for detecting multiple transmitter faults and responding to the CNF signals is shown in FIG. 21.

More specifically, transceivers 630 latch the ID signals during each T2 CLK pulse. The received identification signals are coupled to a comparator 631 that generates an ID OK signal whenever the incoming identification signals correspond to the ID of the nexus as determined by the TRSEL signals generated in the priority assignment circuit 400 shown in FIG. 17A. Whenever the ID OK signal is asserted, it conditions a control circuit 632 to establish a sequence of the states in accordance with the mask signals for controlling subsequent operations. The ID OK signal also enables AND gates 633 and 634. If READ DATA is received and a READ DATA operation is pending, the AND gate 634 enables the circuit 632. If a READ DATA operation is not pending, however, the AND gate 633 generates an unexpected RD signal and energizes an OR gate 635 thereby to condition a flip-flop 636 to generate a XMIT FAULT signal on a subsequent T1 CLK pulse. This signal is conveyed to transceivers such as transceiver 615.

Whenever a nexus is to operate as a commander nexus, control circuitry within the nexus generates an SET CMD RDY signal that presets a flip-flop 640. A next T1 CLK pulse sets a flip-flop 641 thereby to condition another flip-flop 642 to be set by an AND gate 643 if a flip-flop 644 is cleared thereby indicating that no current request is being processed. When the flip-flop 642 sets, it energizes an OR gate 643a thereby to enable the flip-flop 644 to be set on the next T3 CLK pulse. Simultaneously, the flip-flop 642 conditions a multiplexer latch 645 to receive the TRSEL signals from the priority assignment circuit 400 in FIG. 17. On the subsequent T1 CLK pulse the output signals from the multiplexer latch correspond to the TRSEL signals and are conveyed to the transceiver 630. They then are transmitted onto the SBI response to the next T0 CLK pulse. When the information is transmitted onto the bus through the transceiver 630, normally that same information should be latched into the transceiver 630. Thus, a comparator 646 should assert an XMT/REC ID OK signal. If different identification signals are received because multiple transmitters are operating simultaneously, an AND gate 647 will be energized in response to an XMIT CYC signal indicating that a transmitting operation is being performed. As a result the AND gate 647 generates the ASRT MLT XMT FLT signal that energizes the OR gate 635 and causes a FAULT to be transmitted. As a CLK VALID CMD signal is only asserted when the information on the bus designates a particular nexus, a latch 650 receives the identification information only when it has been addressed. Thus when the flip-flop 642 sets indicating the data is to be transmitted onto the SBI 14, the multiplexer latch is conditioned to store the signals from the latch 650 thereby to transmit the ID signals corresponding to the commander nexus when the responder nexus transmits the data.

Finally, if the comparator 631 does not assert the ID OK signal and a timing circuit generates timing pulse 0, an AND gate 651 is energized thereby to enable the flip-flop 636 to set and indicate a FAULT condition.

Whenever the flip-flop 642 sets and generates the CMD REQ signal, an AND gate 660 is energized by a DT READ signal indicating that data is being read. The AND gate 660 then enables an AND gate 661. Timing pulse 4 also enables the AND gate 661. Circuitry analagous to the shift register 107 shown in FIG. 8 in a commander nexus generates the timing pulse. This signal corresponds to the time that an acknowledgement should be received after the initiation of an extended writing operation. If an acknowledge signal is received, an AND gate 662 is enabled so that the T0 CLK signal energizes the AND gate 661 and an OR gate 663 generates an REQ COMPLETE signal that indicates the completion of the request. This signal, through other circuitry not shown, produces the REQ DONE signal that clears the flip-flop 644 and other circuits. If an error condition is detected, however, an AND gate 664 enables an AND gate 665, during the timing pulse 2 time, to generate a SET ERROR signal. This will enable error response circuits in the nexus to operate and will force the REQ COMPLETE signal to be asserted thereby to abort the operation.

(5) File Fullness Circuitry

FIG. 12 also discloses a file control logic 214 that controls access to the TAG function command file 212.

Figure 22:
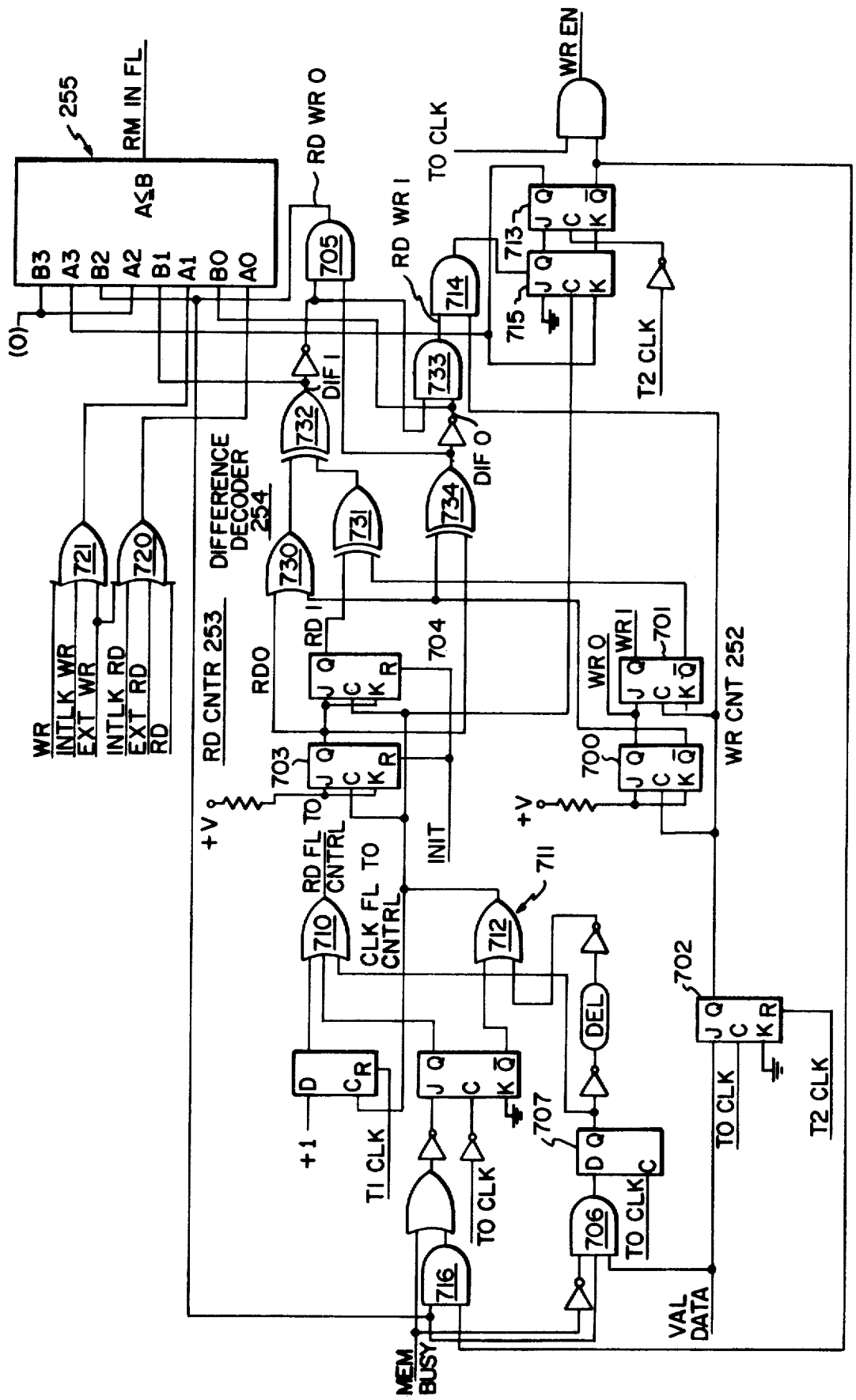
FIG. 22 is a logic diagram of one embodiment of the file control logic shown in FIG. 12.

As shown in FIG. 22, the write counter 252 comprises a flip-flop 700 and a flip-flop 701 that generate WR 0 and WR 1 signals respectively. The write counter is advanced by pulses from a flip-flop 702. If valid data is presented from another nexus, then the next T0 CLK pulse sets the flip-flop 702 and clocks the flip-flops 700 and 701. The next T2 CLK pulse clears the flip-flop 702 to terminate the clocking pulse for the write counter 252.

The read counter 253 comprises flip-flops 703 and 704 that generate RD0 and RD1 signals respectively. There are two conditions that can exist within the memory which will advance the read counter 253. If the file contains information, an RD WR 0 signal from an AND gate 705 enables an AND gate 706. If the memory element is not currently undergoing a cycle, an MEM BUSY signal is not asserted and valid data is present, an AND gate 706 conditions a flip-flop 707 to be clocked on the trailing edge of the T0 CLK pulse. This energizes an OR gate 710 that initiates a transfer of information onto the file bus. After a time delay established by a time delay circuit 711 an OR gate 712 is energized to produce the clocking input signal to the flip-flops 703 and 704. If the file is empty and valid information is received, a similar operation occurs.

Overflow logic associated with the read counter 253 is set by the T2 CLK pulse if the difference decoder 254 generates an RD WR 1 signal, which is asserted when the write counter 252 is one count behind the read counter 253 and the file is being written into. If this occurs and the flip-flop 702 is set, an AND gate 714 presets a flip-flop 715 and the next T2 CLK pulse sets the flip-flop 713. When the flip-flop 713 sets, further advancement of the write counter 252 is prevented because an AND gate 716 is then disabled. When the overflow flag is set the RM IN FL signal from the comparator 255 shifts to a non-asserted level and this prevents the assertion of a VALID DATA signal by disabling the AND gate 706 and conditioning the flip-flop 702 so that it cannot be set.

The room-in-file comparator 255 comprises a comparison circuit that receives a number of input signals. It determines whether the numeric value of the signals at the A inputs is less than or equal to the numeric value of the signals at the B inputs. If this condition exists, the RM IN FL signal is asserted. The B inputs receive a DIF 0 signal, a DIF 1 signal, the RD WR 0 signal and a "0" value at the B0 through B3 inputs respectively. During a reading operation or an extended writing operation, an OR gate 720 energizes an A0 input. An A1 input is energized during a writing operation, including an extended writing operation, by an OR gate 721. The A2 signal has a 0 value and the A3 signal input is energized if an overflow condition exists. IT will be apparent therefore, that an overflow establishes a condition that precludes the generation of the RM IN FL signal. During a reading operation, the comparator 255 is conditioned to determine if only a single location is available for the command. During a writing operation two locations must be available for the command and first data word unless an extended writing operation is involved whereupon three locations must be available.

The difference decoder 254 comprises a number of gates. An OR gate 730 is energized if the read counter 253 has a 1 or 3 value or if the write counter 252 is at a level 0 or 2. An exclusive OR circuit 731 responds to the RD1 and WR1 signals from the flip-flops 704 and 701 respectively. An exclusive OR circuit 732 asserts the DIF 1 signal when one of the gates 730 and 731 is energized and the other is not. Whenever the DIF 1 signal is asserted and the DIF 0 is asserted, the AND gate 705 is enabled to generate the RD WR 0 signal. Another AND gate 733 is enabled to generate the RD WR 1 signal when DIF 0 is asserted and DIF 1 is not asserted. The exclusive OR circuit 734 is energized if either the flip-flop 700 is reset or the flip-flop 703 is set, but not both. Whenever the exclusive OR circuit 734 is not energized, the decoder 254 generates the DIF 0 signal. Thus, the comparator 255 and other circuitry in FIG. 22 constantly monitors the state of the command file 212 to indicate whether there is sufficient room to accept the next incoming data.

The foregoing description is limited to a specific embodiment of this invention. It will be apparent, however, that this invention can be practiced in data processing systems having diverse basic construction or in systems that use different internal circuitry than is described in this specification with the attainment of some or all of the foregoing objects and advantages of this invention. Therefore, it is the object of the appended claims to cover all such variations and modifications as come within the true spirit and scope of this invention.

What we claim as new and desire to secure by Letters Patent of the United States is:

1. A memory array means for connection in a memory system wherein the memory system includes controller means for generating a sequence of address signals, predetermined data signals, a write control signal and an initialization control signal, said memory array means being connected to the controller means and comprising:
   A. a plurality of memory module means, each said memory module means including:
      i. a plurality of addressable storage locations,
      ii. addressing means for selecting one of said storage locations in response to first address signals from the controller means,
      iii. control means for controlling the transfer functions within said storage locations, and
      iv. data transfer means for transferring data to and from the storage location selected by said addressing means in response to said control means,
   B. transfer means for selectively establishing data paths between the controller means and said storage locations in all said memory module means, and
   C. module selection means connected to said transfer means and said memory module means for selectively enabling one of said control means in said memory module means to transfer data in response to second address signals from said controller means for setting all storage locations in said memory array means to predetermined values including:
      i. first means connected to said transfer means for establishing a data path from said transfer means to all said memory module means in parallel in response to the initialization control signal from
      ii. second means connected to said transfer means to receive said initialization control signal and further connected to said control means in each said memory module for selecting all said memory modules in parallel to respond to the second address signals from the controller means thereby to transfer a predetermined data into all said modules in parallel.

2. A memory array means as recited in claim 1 wherein said transfer means includes driver means and receiver means and the information in said storage locations includes data and error check codes, said receiver means being selected in response to the initialization control signal for transferring both data and error correction codes to said module means.

3. A memory array means as recited in claim 1 wherein said module selection means includes address decoding means and means responsive to the initialization control signal for enabling a plurality of writing signal gating means to generate writing enabling signals to each said module means in each said module means thereby to initiate a writing operation.

4. A memory system for connection to a data processing system wherein said memory system comprises:
   A. at least one memory array means including:
      i. plural memory module means each including:
         a. a plurality of storage locations,
         b. addressing means for selecting one of said storage locations in response to first address signals,
         c. control means for controlling the transfer functions within said storage locations, and d. data transfer means for transferring data to and from said storage locations, ii. module selection means connected to said transfer means and to said memory module means for selectively enabling one of said control means in said memory module means to transfer data in response to second address signals, and iii. initialization circuit means for receiving an initialization signal for setting all storage locations in all said storage modules to predetermined data values, said initialization circuit means including:

a. first means connected to said transfer means for establishing a data path from said data transfer means to all said memory module means in response to the initialization signal, and b. second means connected to said module means and to said control means in each said memory module for enabling all said storage means in all said module means in parallel simultaneously in response to the initialization signal thereby to transfer predetermined data signals into said locations, B. controller means connecting said memory array means to the data processing system and including:

i. counter means for generating the first address signals in sequence, and ii. initialization cycle control means responsive to the energization of said memory elements for clearing said counter means and generating the initialization signal to enable said initialization circuit means in each said memory array means, C. data path means for connecting said memory module means to said data processing system and being responsive to the initialization signal for generating the predetermined data signals, and D. transfer means for selectively establishing data paths between the controller means and said storage locations in all said memory module means.

5. A memory system as recited in claim 4 wherein said control means includes circuit means connected to said counting means and to said initialization cycle control means for causing all said memory locations in said system to be addressed twice, and means responsive to the completion of the second address cycle for terminating the initialization cycle.

6. A memory system as recited in claim 4 wherein said data path means additionally comprises means for generating error correction codes in response to signals on the data path means and each said memory array including means for conveying the error codes and the data signals to the memory modules.

* * * * *

UNITED STATES PATENT AND TRADEMARK OFFICE
CERTIFICATE OF CORRECTION

PATENT NO. : 4,236,207  Page 1 of 2
DATED : November 25, 1980
INVENTOR(S) : Rado et al It is certified that error appears in the above-identified patent and that said Letters Patent are hereby corrected as shown below:

```
Column 1, line 20, delete "COMPUTER" and insert --COUNTER--.
Column 1, line 53, delete "has" and insert --have--.
Column 3, line 36, after "with" insert --the--.
Column 3, lines 50-51, change "comprises" to --comprise--.
Column 4, line 31, delete "is" and insert --are--.
Column 5, line 50, delete "," (a comma) and insert --.--
    (a period).
Column 6, line 54, delete ";" (a semicolon) and insert --.--
    (a period).
Column 6, line 66, change "FIG." to --FIGS.--.
Column 8, line 1, delete "the" (second occurrence) and insert
    --that--.
Column 9, line 31, delete "a".
Column 10, line 59, after "waits" insert --until--.
Column 11, line 43, change "sequence" to --sequences--.
Column 15, line 63, change "functions" to --function--.
Column 16, line 41, delete "detects" and insert --has detected--.
Column 16, line 48, change "a" to --an--.
Column 17, line 32, delete "a".
Column 18, line 28, change "FIG." to --FIGS.--.
Column 18, line 28, change "discloses" to --disclose--.
Column 18, lines 55-56, change "receives" to --receive--.
Column 18, line 66, delete "the" and insert --this--.
Column 18, line 67, delete "discret" and insert --discrete--.
Column 19, line 9, change "enable" to --enabled--.
Column 19, line 24, delete "a".
Column 20, line 19, delete "th" and insert --the--.
Column 20, line 23, change "produce" to --produces--.
Column 20, line 26, delete ", the" and insert --.  The--.
Column 20, line 37, delete "aserted" and insert --asserted--.
Column 21, line 68, change "PCCLK-H" to --PDCLK-H--.
Column 22, line 6, change "FIG." to --FIGS.--.
Column 22, line 19, change "FIG." to --FIGS.--.
Column 22, line 48, change "circuits" to --circuit--.
```

UNITED STATES PATENT AND TRADEMARK OFFICE
CERTIFICATE OF CORRECTION

PATENT NO. : 4,236,207

DATED : November 25, 1980

INVENTOR(S) : Rado et al

It is certified that error appears in the above-identified patent and that said Letters Patent are hereby corrected as shown below:

Column 23, line 28, delete "AND" and insert --NAND--.
Column 23, line 45, delete "disloses" and insert --discloses--.
Column 23, line 46, delete "plurality" and insert --priority--.
Column 23, line 55, change "pulses" to --pulse--.
Column 24, line 25, delete "TR" and insert --to--.
Column 24, line 26, delete "to" and insert --TR--.
Column 24, line 53, delete "BS" and insert --BUS--.
Column 26, line 34, before "occur" insert --to--.
Column 26, line 44, after "This" insert --pulse--.
Column 27, line 24, delete "On" and insert --One--.
Column 27, line 58, delete "respose" and insert --response--.
Column 28, line 37, delete "this" and insert --which--.
Column 28, line 41, delete "but".
Column 29, line 39, delete "unexpected" and insert --UNEXPECTED--.
Column 31, line 29, delete "IT" and insert --It--.
Column 31, line 45, delete "and" and insert --or--.
Column 32, line 36, after "from" insert --the controller means, and--.
Column 32, line 43, delete "a".

Signed and Sealed this

Twenty-third Day of February 1982

[SEAL]

Attest:

Attesting Officer

GERALD J. MOSSINGHOFF

Commissioner of Patents and Trademarks